US011842987B2

(12) United States Patent
Jang et al.

(10) Patent No.: US 11,842,987 B2
(45) Date of Patent: Dec. 12, 2023

(54) LED DISPLAY PANEL, LED DISPLAY APPARATUS HAVING THE SAME AND METHOD OF FABRICATING THE SAME

(71) Applicant: Seoul Viosys Co., Ltd, Ansan-si (KR)

(72) Inventors: Seong Kyu Jang, Ansan-si (KR); Seom Geun Lee, Ansan-si (KR); Chan Seob Shin, Ansan-si (KR); Ho Joon Lee, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 17/866,249

(22) Filed: Jul. 15, 2022

(65) Prior Publication Data

US 2022/0367427 A1     Nov. 17, 2022

Related U.S. Application Data

(63) Continuation of application No. 16/855,258, filed on Apr. 22, 2020, now Pat. No. 11,424,224.

(Continued)

(51) Int. Cl.
*H01L 25/075*     (2006.01)
*H01L 33/58*     (2010.01)
(Continued)

(52) U.S. Cl.
CPC ...... *H01L 25/0753* (2013.01); *H01L 33/0093* (2020.05); *H01L 33/58* (2013.01);
(Continued)

(58) Field of Classification Search
CPC . H01L 25/0753; H01L 33/58; H01L 33/0093; H01L 33/62; H01L 2933/0066; H01L 2933/0058
See application file for complete search history.

(56) References Cited

U.S. PATENT DOCUMENTS 10,193,042 B1 *   1/2019   Tsai ..................... H01L 33/60
2012/0089180 A1 *   4/2012   Fathi ..................... B32B 9/04
                                                                                     257/E23.116
(Continued)

FOREIGN PATENT DOCUMENTS

JP     2017-117814     6/2017
JP     2019-015899     1/2019
(Continued)

OTHER PUBLICATIONS

Non-Final Office Action dated Jul. 13, 2021, issued to U.S. Appl. No. 16/855,258.

(Continued)

*Primary Examiner* — Victor A Mandala
(74) *Attorney, Agent, or Firm* — H.C. Park & Associates, PLC

(57) ABSTRACT

A display panel including a circuit board having pads, light emitting devices electrically connected to the pads and arranged on the circuit board, each light emitting device having a first surface facing the circuit board and a second surface opposite to the first surface, a buffer material layer disposed between the circuit board and the light emitting devices to fill a space between the circuit board and the light emitting devices, and a cover layer covering the second surface of the light emitting devices, in which the buffer material layer is disposed under the first surfaces of the light emitting devices and has grooves in a region between adjacent light emitting devices, a portion of a top surface of the buffer material layer is disposed between adjacent light emitting devices, and the cover layer fills the grooves of the buffer material layer.

20 Claims, 17 Drawing Sheets

Related U.S. Application Data

(60) Provisional application No. 62/837,800, filed on Apr. 24, 2019.

(51) Int. Cl.
  *H01L 33/00*   (2010.01)
  *H01L 33/62*   (2010.01)

(52) U.S. Cl.
  CPC ...... *H01L 33/62* (2013.01); *H01L 2933/0058* (2013.01); *H01L 2933/0066* (2013.01)

(56) References Cited

U.S. PATENT DOCUMENTS

| | | | |
|---|---|---|---|
| 2015/0255439 A1* | 9/2015 | Kim | H01L 25/0753 257/89 |
| 2017/0263593 A1 | 9/2017 | Zou et al. | |
| 2017/0271290 A1* | 9/2017 | Liao | H01L 24/16 |
| 2017/0288093 A1 | 10/2017 | Cha et al. | |
| 2018/0019234 A1* | 1/2018 | Hu | H01L 24/92 |
| 2018/0076182 A1* | 3/2018 | Wu | H01L 25/0753 |
| 2018/0190876 A1* | 7/2018 | Liu | H01L 33/62 |
| 2019/0088196 A1* | 3/2019 | Chu | G09G 3/2003 |
| 2019/0181122 A1* | 6/2019 | Hsu | H01L 33/62 |
| 2019/0252460 A1* | 8/2019 | Andrews | H01L 33/50 |
| 2019/0348588 A1* | 11/2019 | Hsieh | H01L 25/0753 |
| 2019/0393179 A1* | 12/2019 | Chen | H01L 24/17 |
| 2020/0235077 A1* | 7/2020 | Jeon | H01L 22/12 |

FOREIGN PATENT DOCUMENTS

| | | |
|---|---|---|
| KR | 10-2017-0115142 | 10/2017 |
| KR | 10-2019-0006430 | 1/2019 |
| KR | 10-2019-0010223 | 1/2019 |

OTHER PUBLICATIONS

Final Office Action dated Dec. 30, 2021, issued to U.S. Appl. No. 16/855,258.
Notice of Allowance dated Mar. 16, 2022, issued to U.S. Appl. No. 16/855,258.
Notice of Allowance dated Apr. 8, 2022, issued to U.S. Appl. No. 16/855,258.
International Search Report dated Jul. 29, 2020 in International Application No. PCT/KR2020/0005382.

* cited by examiner

LED DISPLAY PANEL, LED DISPLAY APPARATUS HAVING THE SAME AND METHOD OF FABRICATING THE SAME

CROSS REFERENCE TO RELATED APPLICATIONS

This application is a Continuation of U.S. patent application Ser. No. 16/855,258, filed on Apr. 22, 2020, which claims the benefit of U.S. Provisional Application No. 62/837,800, filed on Apr. 24, 2019, each of which is hereby incorporated by reference for all purposes as if fully set forth herein.

BACKGROUND

Field

Exemplary embodiments of the invention relate generally to an LED display panel, and more specifically, to an LED display panel that is capable of safely transferring a plurality of light emitting devices for a display, an LED display apparatus having the same, and a method of fabricating the same.

Discussion of the Background

As an inorganic light source, light emitting diodes have been used in various fields including displays, vehicular lamps, general lighting, and the like. With various advantages of light emitting diodes, such as longer lifespan, lower power consumption, and rapid response than conventional light sources, light emitting diodes have been replacing conventional light sources.

Light emitting diodes have been used as backlight light sources in display apparatuses. However, LED displays that directly display images using the light emitting diodes have been recently developed.

In general, a display apparatus realizes various colors through mixture of blue, green, and red light. In order to realize display images, the display apparatus includes a plurality of pixels, each including sub-pixels corresponding to blue, green, and red light, respectively. In this manner, a color of a certain pixel is determined based on the colors of the sub-pixels so that images can be displayed through combination of such pixels.

Since LEDs can emit various colors depending upon materials thereof, a display apparatus may be configured by arranging individual LED chips emitting blue, green, and red light on a two-dimensional plane.

In general, LEDs used in a conventional large-sized electronic display are manufactured in packages. The LED packages are arranged in units of pixels, and individual packages are typically mounted on a circuit board. However, a display of a small electronic product, such as a smart watch or a mobile phone, a VR headset, AR glasses, or a display such as a TV may employ micro LEDs having a smaller size than those in a conventional LED package to realize clear image quality.

In general, it is difficult to mount the small-sized LEDs individually on a circuit board due to their small size. As such, a method of forming a plurality of LEDs using semiconductor layers that are grown on a substrate, and transferring the LEDs onto a display circuit board in a group at pixel intervals has been studied. In this case, however, when a failure occurs in some of the LEDs while transferring the plurality of LEDs in a group, it is difficult to replace the defective LEDs. In particular, when the LEDs are separated from the growth substrate using a technique such as laser lift-off, defects such as a crack may occur in the LED from the impact of a laser. Accordingly, there is a need for a method of safely transferring the LEDs in a group to the circuit board of a display apparatus without causing a failure.

Moreover, since the sub-pixels are arranged on the two-dimensional plane in the display apparatus, a relatively large area is occupied by one pixel that includes the sub-pixels for blue, green, and red light. In this case, when an area of each sub-pixel is reduced to arrange the sub-pixels in a restricted area, luminous area of the sub-pixels may be reduced, thereby deteriorating the brightness of the pixels.

The above information disclosed in this Background section is only for understanding of the background of the inventive concepts, and, therefore, it may contain information that does not constitute prior art.

SUMMARY

Exemplary embodiments provide an LED display apparatus where a plurality of light emitting devices can be safely transferred onto a circuit board.

Exemplary embodiments also provide a method of safely transferring light emitting devices fabricated on a wafer onto a circuit board in a group.

Exemplary embodiments further provide a method of safely transferring a light emitting device for a display that is capable of increasing an area of each sub-pixel in a restricted pixel area and a display apparatus including the same.

Additional features of the inventive concepts will be set forth in the description which follows, and in part will be apparent from the description, or may be learned by practice of the inventive concepts.

A display panel according to an exemplary embodiment includes a circuit board having pads, light emitting devices electrically connected to the pads and arranged on the circuit board, each light emitting device having a first surface facing the circuit board, and a buffer material layer disposed between the circuit board and the light emitting devices to fill a space between the circuit board and the light emitting devices, in which the buffer material layer is disposed under the first surfaces of the light emitting devices.

The buffer material layer may cover a surface of the circuit board disposed between the light emitting devices, and may have a plurality of grooves in a region between adjacent light emitting devices.

Each of the light emitting devices may include electrode pads, and the electrode pads may be electrically connected to the pads.

The display panel may further include conductive particles disposed between the pads of the circuit board and the electrode pads of the light emitting devices, in which the pads and the electrode pads may be electrically connected by the conductive particles.

The conductive particles may be spaced apart from one another in a region between the light emitting devices.

The display panel may further include a light blocking material layer disposed in the region between the light emitting devices to block light emitted through side surfaces of the light emitting devices.

The light blocking material layer may cover a portion of an upper surface of the buffer material layer.

The display panel may further include a solder layer disposed between the pads and the electrode pads, in which the pads and the electrode pads may be electrically connected by the solder layer.

The light emitting devices may include electrode pads electrically connected to first, second, and third LED stacks, and bump pads disposed on the electrode pads, and the bump pads may be electrically connected to the pads of the circuit board.

The display panel may further include a bonding layer between the pads of the circuit board and the bump pads, in which the bonding layer may include at least one of In, Pb, AuSn, CuSn, and solder.

The buffer material layer may include cured resin, polymer, BCB, or SOG.

Each of the light emitting devices may include a first LED stack, a second LED stack, and a third LED stack, and the first, second, and third LED stacks may be configured to emit light having different wavelengths.

Light generated from the first, second, and third LED stacks may be configured to be emitted to the outside through the third LED stack.

The third LED stack may not include a growth substrate.

An interval between the light emitting devices may be greater than a width of the light emitting device.

The buffer material layer may cover a surface of the circuit board disposed between the light emitting devices, the buffer material layer may includes conductive particles, and the conductive particles may be more densely disposed in a region between the circuit board and the light emitting device than the region between the light emitting devices.

A display apparatus according to another exemplary embodiment includes a display panel including a circuit board having pads, light emitting devices electrically connected to the pads and arranged on the circuit board, each light emitting device having a first surface facing the circuit board, and a buffer material layer disposed between the circuit board and the light emitting devices to fill a space between the circuit board and the light emitting device, in which the buffer material layer is disposed under the first surfaces of the light emitting devices.

The buffer material layer may cover a surface of the circuit board disposed between the light emitting devices, and may have a plurality of grooves in a region between adjacent light emitting devices.

Each of the light emitting devices may include electrode pads, and the electrode pads may be electrically connected to the pads.

Each of the light emitting devices may include a first LED stack, a second LED stack, and a third LED stack, the first, second, and third LED stacks may be configured to emit light having different wavelengths, and light generated from the first, second, and third LED stacks may be configured to be emitted to the outside through the third LED stack.

The display apparatus may further include a light blocking material layer disposed in a region between the light emitting devices to block light emitted to side surfaces of the light emitting devices.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
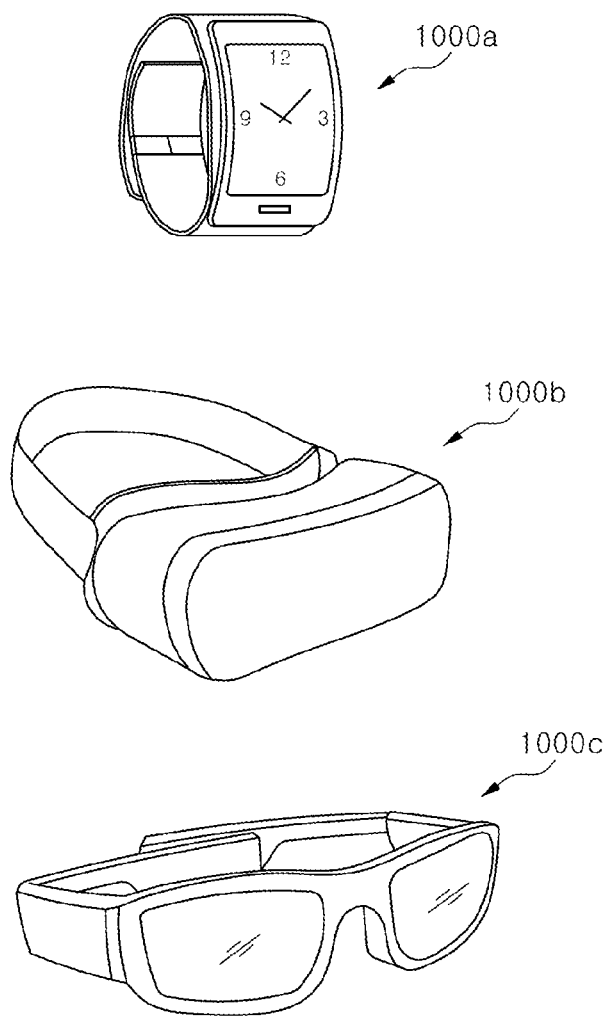
FIG. 1 shows schematic perspective views illustrating display apparatuses according to exemplary embodiments.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the present disclosure will be described in detail with reference to the accompanying drawings.

FIG. 1 shows schematic perspective views illustrating display apparatuses according to exemplary embodiments.

The light emitting device according to exemplary embodiments may be used in a virtual reality (VR) display apparatus, such as a smart watch 1000a or a VR headset 1000b, or an augmented reality (AR) display apparatus, such as augmented reality glasses 1000c, without being limited thereto.

Figure 2:
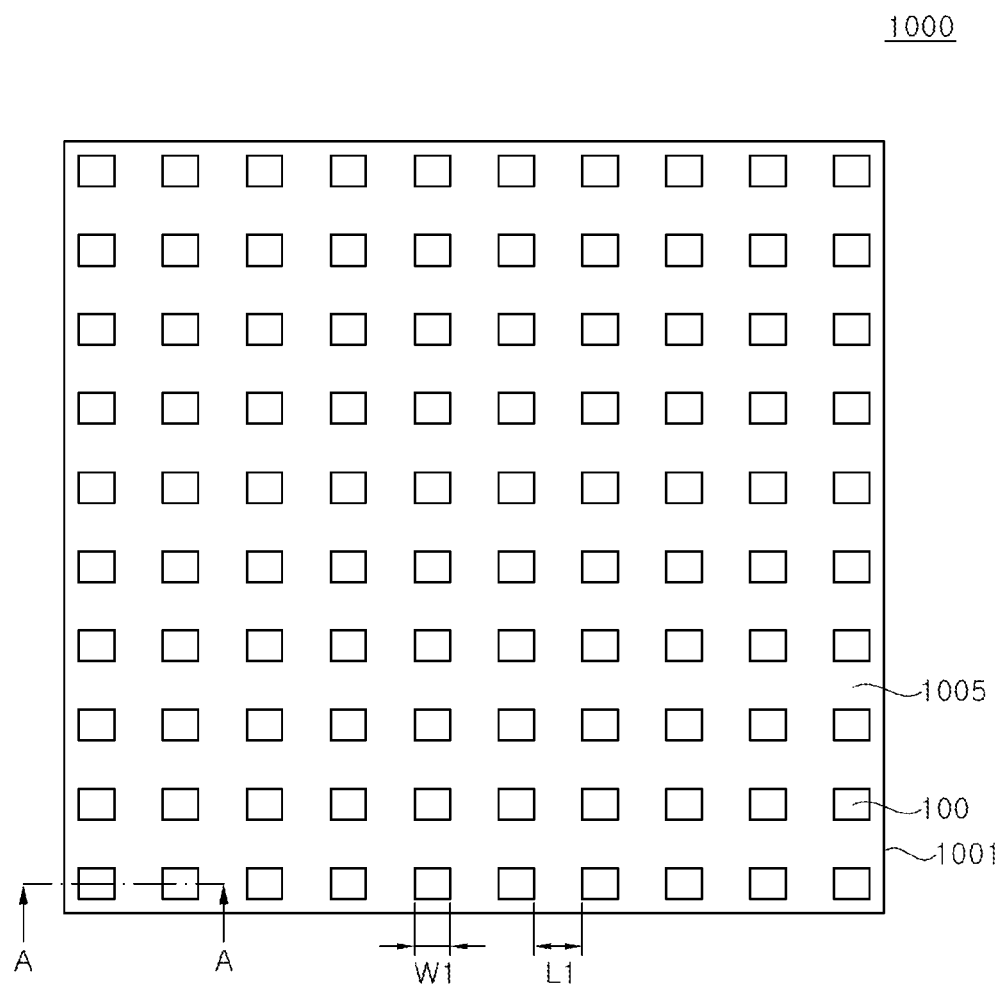
FIG. 2 is a schematic plan view illustrating a display panel according to an exemplary embodiment.

A display panel for displaying an image is mounted in the display apparatus. FIG. 2 is a schematic plan view illustrating a display panel 1000 according to an exemplary embodiment, and FIG. 3 is a cross-sectional view taken along line A-A of FIG. 2.

Figure 3:
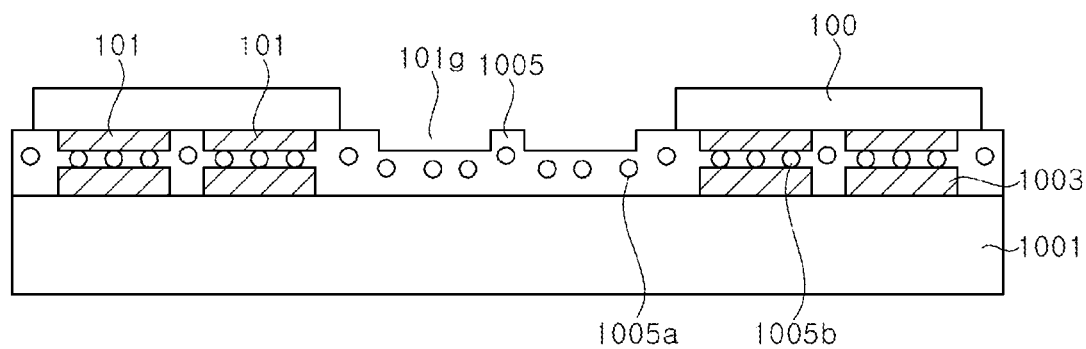
FIG. 3 is a schematic enlarged cross-sectional view taken along line A-A of FIG. 2.

Referring to FIGS. 2 and 3, the display panel includes a circuit board 1001, light emitting devices 100, and a buffer material layer 1005.

The circuit board 1001 (or a panel board) may include a circuit for passive matrix driving or active matrix driving. In an exemplary embodiment, the circuit board 1001 may include interconnection lines and resistors therein. In another exemplary embodiment, the circuit board 1001 may include interconnection lines, transistors, and capacitors. The circuit board 1001 may also have pads 1003 on an upper surface thereof for allowing electrical connection to a circuit disposed therein.

A plurality of light emitting devices 100 is arranged on the circuit board 1001. The light emitting devices 100 may be small-sized light emitting devices having a micro-unit size. For example, a width W1 of the light emitting device 100 may be about 300 µm or less, further about 200 µm or less, and more specifically about 100 µm or less. The light emitting devices 100 may have a size of, for example, 200 µm×200 µm or less, and further, 100 µm×100 µm or less. In an exemplary embodiment, an interval L1 between the light emitting devices 100 may be wider than the width W1 of the light emitting devices 100.

The light emitting device 100 has electrode pads 101, and the electrode pads 101 are electrically connected to the circuit board 1001. For example, the electrode pads 101 may be bonded to the pads 1003 exposed on the circuit board 1001. The electrode pads 101 may have substantially the same size as one another, or may have different sizes from one another. The electrode pads 101 have a relatively large area, and may have a maximum width that is about ¼ to about ¾ or less of a maximum width of the light emitting device 100. A minimum width of each electrode pad 101 may be about ⅕ to about ¾ or less of a minimum width of the light emitting device 100. An interval between the electrode pads 101 may be about 3 µm or more, specifically 5 µm or more, and further about 10 µm or more.

Each of the light emitting devices 100 may form one pixel. For example, each of light emitting devices 100 may include blue, green, and red sub-pixels.

Figure 4:
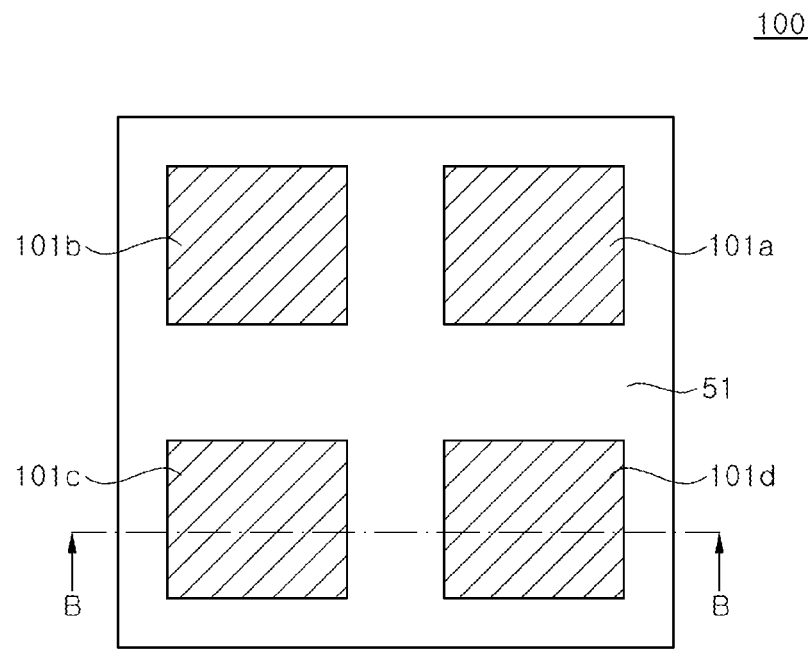
FIG. 4 is a schematic plan view illustrating a light emitting device according to an exemplary embodiment.
Figure 5:
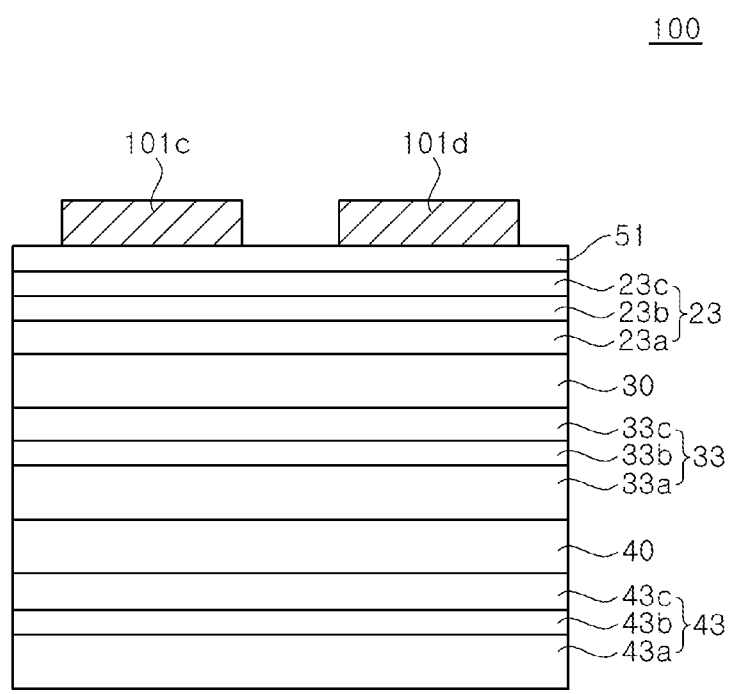
FIG. 5 is a schematic cross-sectional view taken along line B-B of FIG. 4.
Figure 6:
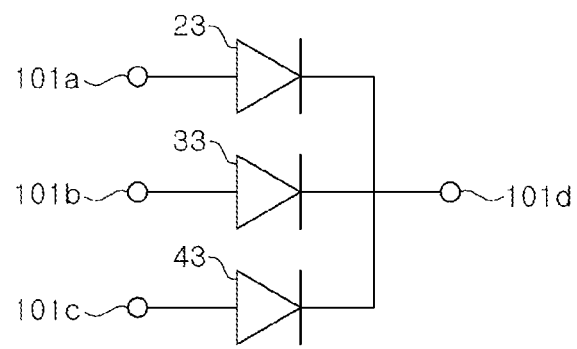
FIG. 6 is a schematic circuit diagram of a light emitting device according to an exemplary embodiment.

A configuration of the light emitting device 100 will be described with reference to FIGS. 4, 5, and 6. FIG. 4 is a schematic cross-sectional view illustrating a light emitting device 100 according to an exemplary embodiment, FIG. 5 is a schematic cross-sectional view taken along line B-B of FIG. 4, and FIG. 6 is a schematic circuit diagram of the light emitting device 100 according to an exemplary embodiment. Hereinafter, although the electrode pads 101a, 101b, 101c, and 101d are exemplarily illustrated and described as being disposed at an upper side of the light emitting device 100 in FIGS. 4 and 5, however, the inventive concepts are not limited thereto. For example, in some exemplary embodiments, the light emitting device 100 may be flip-bonded on the circuit board 1001 as shown in FIG. 3, and in this case, the electrode pads 101a, 101b, 101c, and 101d may be disposed at a lower side of the light emitting device 100.

Referring to FIGS. 4 and 5, the light emitting device 100 may include a first LED stack 23, a second LED stack 33, a third LED stack 43, and a first bonding layer 30, a second bonding layer 40, a first insulation layer 51, and electrode pads 101a, 101b, 101c, and 101d.

The first, second, and third LED stacks 23, 33, and 43 may be formed using semiconductor layers, and may be grown on different growth substrates from one another, respectively. According to an exemplary embodiment, each of the growth substrates may be removed from the first, second, and third LED stacks 23, 33, and 43. As such, the light emitting device 100 may not include the substrates that are used to grow the first, second, and third LED stacks 23, 33, and 43. However, the inventive concepts are not limited thereto, and in some exemplary embodiments, at least one of the growth substrates may be retained in the light emitting device 100 without being removed.

The first, second, and third LED stacks 23, 33, and 43 are stacked in the vertical direction. The first LED stack 23, the second LED stack 33, and the third LED stack 43 include a first conductivity type semiconductor layer 23a, 33a, or 43a, a second conductivity type semiconductor layer 23c, 33c, or 43c, and active layers 23b, 33b, and 43b interposed therebetween, respectively. The active layers 23b, 33b, and 43b may have multiple quantum well structures, for example.

The second LED stack 33 is disposed under the first LED stack 23, and the third LED stack 43 is disposed under the second LED stack 33. Hereinafter, the second LED stack 33 is described as being disposed under the first LED stack 23, and the third LED stack 43 is described as being disposed under the second LED stack 33, however, in some exemplary embodiments, the light emitting device may be flip-bonded. In this case, upper and lower positions of the first, second, and third LED stacks 23, 33, and 43 may be reversed.

Light generated in the first, second, and third LED stacks 23, 33, and 43 may be emitted to the outside through the third LED stack 43. Accordingly, the first LED stack 23 may emit light having a longer wavelength than those emitted from the second and third LED stacks 33 and 43, and the second LED stack 33 may emit light having a longer wavelength than that emitted from the third LED stack 43. For example, the first LED stack 23 may be an inorganic light emitting diode emitting red light, the second LED stack 33 may be an inorganic light emitting diode emitting green light, and the third LED stack 43 may be an inorganic light emitting diode to emitting blue light. For example, the first LED stack 23 may include an AlGaInP-based well layer, the second LED stack 33 may include an AlGaInP or AlGaInN-based well layer, and the third LED stack 43 may include an AlGaInN-based well layer.

In some exemplary embodiments, while light generated in the first, second, and third LED stacks 23, 33, and 43 may be emitted to the outside through the third LED stack 43, at least one of the first, second, and third LED stacks 23, 33, and 43 may emit light having a shorter wavelength than that emitted from the LED stack disposed thereunder along the path of light. For example, the first LED stack 23 may be an inorganic light emitting diode emitting red light, the second LED stack 33 may be an inorganic light emitting diode emitting blue light, and the third LED stack 43 may be an inorganic light emitting diode to emitting blue light. In still another exemplary embodiment, the light emitting device 100 may include two, or four or more LED stacks. In this case, each of the LED stacks may emit light having a wavelength different from each other, or at least two of the LED stacks may emit light having substantially the wavelength. Hereinafter, the light emitting device 100 will exemplarily be described as including the first, second, and third LED stacks 23, 33, and 43 emitting red light, green light, and blue light, respectively.

Since the first LED stack 23 emits light having the longer wavelength than those of the second and third LED stacks 33 and 43, light generated from the first LED stack 23 may be emitted to the outside after passing through the second and third LED stacks 33 and 43. In addition, since the second LED stack 33 emits light having a longer wavelength than that of the third LED stack 43, light generated from the second LED stack 33 may be emitted to the outside after passing through the third LED stack 43.

According to the illustrated exemplary embodiment, the first conductivity type semiconductor layer 23a, 33a, or 43a of each of the LED stacks 23, 33, and 43 may be an n-type semiconductor layer, and the second conductivity type semiconductor layer 23c, 33c, or 43c thereof may be a p-type semiconductor layer. In addition, according to the illustrated exemplary embodiment, although the first conductivity type semiconductor layers 23a, 33a, and 43a are shown as being disposed on lower surfaces of the first, second, and third LED stacks 23, 33, and 43, and the second conductivity type semiconductor layers 23c, 33c, and 43c are shown as being disposed of upper surfaces thereof, in some exemplary embodiments, a stacked sequence of the semiconductor layers may be reversed in at least one of the LED stacks. For example, in some exemplary embodiments, the first conductivity type semiconductor layer 23a may be disposed on the upper surface of the first LED stack 23, and the second conductivity type semiconductor layers 33c and 43c may be disposed on the upper surfaces of the second LED stack 33 and the third LED stack 43. In some exemplary embodiments, the first conductivity type semiconductor layer 23a, 33a, or 43a of each of the LED stacks 23, 33, and 43 may be a p-type semiconductor layer, and the second conductivity type semiconductor layer 23c, 33c, and 43c thereof may be an n-type semiconductor layer.

The first LED stack 23, the second LED stack 33, and the third LED stack 43 according to the illustrated exemplary embodiment are stacked to overlap one another. In addition, as shown in the drawing, the first LED stack 23, the second LED stack 33, and the third LED stack 43 may have substantially the same luminous area. However, the first and second LED stacks 23 and 33 may have through holes for allowing electrical connection, and accordingly, the luminous areas of the first LED stack 23 and the second LED stack 33 may be smaller than that of the third LED stack 43.

The first bonding layer 30 couples the first LED stack 23 to the second LED stack 33. The first bonding layer 30 may be disposed between the first conductivity type semiconductor layer 23a and the second conductivity type semiconductor layer 33c. The first bonding layer 30 may be formed of a transparent organic material layer, or may be formed of a transparent inorganic material layer. For example, the organic material layer may include SU8, poly methylmethacrylate (PMMA), polyimide, parylene, benzocyclobutene (BCB), or the like, and the inorganic material layer may include $Al_2O_3$, $SiO_2$, $SiN_x$, or the like. In addition, the first bonding layer 30 may be formed of spin-on-glass (SOG).

The second bonding layer 40 couples the second LED stack 33 to the third LED stack 43. As shown in the drawing, the second bonding layer 40 may be disposed between the first conductivity type semiconductor layer 33a and the second conductivity type semiconductor layer 43c. The second bonding layer 40 may be formed of substantially the same material as that described for the first bonding layer 30, and thus, repeated descriptions thereof will be omitted to avoid redundancy.

The first insulation layer 51 may cover the first LED stack 23. The first insulation layer 51 may also cover side surfaces of the first, second, and third LED stacks 23, 33, and 43. The first insulation layer 51 may be formed of a silicon oxide film or a silicon nitride film.

The electrode pads 101 (101a, 101b, 101c, and 101d) may be disposed on the first insulation layer 51. The electrode pads 101a, 101b, 101c, and 101d may be electrically connected to the first, second, and third LED stacks 23, 33, and 43 through the first insulation layer 51.

Referring to FIG. 6, the electrode pads 101a, 101b, and 101c are electrically connected to anodes of the first, second, and third LED stacks 23, 33, and 43, respectively, and the electrode pad 101d may be commonly connected to cathodes of the first, second, and third LED stacks 23, 33, and 43. To electrically connect the electrode pads 101a, 101b, and 101c and the anodes of the first, second, and third LED stacks 23, 33, and 43, a transparent electrode may be formed on at least one of the second conductivity type semiconductor layers 23c, 33c, and 43c of the first, second, and third LED stacks 23, 33, and 43.

Figure 7:
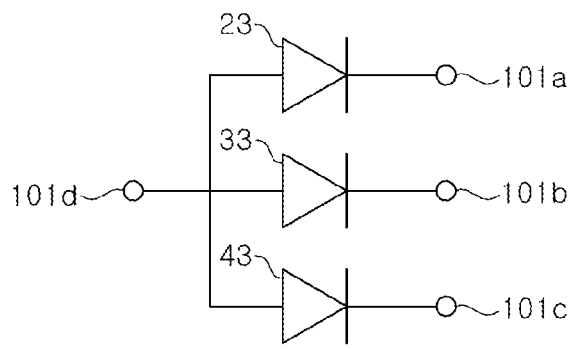
FIG. 7 is a schematic circuit diagram of a light emitting device according to another exemplary embodiment.

In FIG. 6, although the electrode pad 101d is described as being commonly connected to the cathodes of the first, second, and third LED stacks 23, 33, and 43, however, the inventive concepts are not limited thereto. For example, as shown in FIG. 7, the electrode pad 101d may be commonly connected to the anodes of the first, second, and third LED stacks 23, 33, and 43. In this case, the electrode pads 101a, 101b, and 101c may be connected to the cathodes of the first, second, and third LED stacks 23, 33, and 43, respectively.

According to an exemplary embodiment, the first, second, and third LED stacks 23, 33, and 43 may be individually driven by the electrode pads 101a, 101b, 101c, and 101d. The electrode pads 101a, 101b, 101c, and 101d may be formed to have a relatively large area for stable electrical connection. For example, each of the electrode pads 101a, 101b, 101c, and 101d may have an area greater than ¼ of an area of an upper surface of the light emitting device 100.

Referring back to FIGS. 2 and 3, the buffer material layer 1005 fills a region between the light emitting devices 100 and the circuit board 1001. In addition, the buffer material layer 1005 may cover the pads 1003 of the circuit board 1001 between the light emitting devices 100. The buffer material layer 1005 may cover side surfaces of the electrode pads 101 and contact a lower surface of the light emitting device 100. An upper surface of the buffer material layer 1005 is generally disposed under the light emitting devices 100. A portion of the buffer material layer 1005 may partially cover the side surface of the light emitting device 100. However, the portion of the buffer material layer 1005 covering the side surface of the light emitting device 100 does not exceed an elevation of the upper surface of the light emitting devices 100.

As shown in FIG. 3, the buffer material layer 1005 may include conductive particles 1005a and 1005b dispersed in the buffer material layer 1005. The conductive particles 1005a are spaced apart from one another in a region between the pads 1003, and thus, the conductive particles 1005a do not provide an electrical path. The conductive particles 1005a may have a generally spherical shape, but the inventive concepts are not limited thereto.

The conductive particles 1005b are disposed between the pads 1003 and the electrode pads 101 to electrically connect the pads 1003 and the electrode pads 101. The conductive particles 1005b may be pressed by a pressure, and may have a shape in which a width thereof in the lateral direction is greater than a thickness thereof in the vertical direction. The conductive particles 1005b may be spaced apart from one another, but may also contact one another.

The conductive particles 1005a and 1005b may be, for example, metal particles such as Ni, Au, and Sn, or conductive nano particles such as nanotubes or nanowires. Further, the conductive particles 1005a and 1005b may be conductive particles coated with a metal layer on polymer particles.

Since the conductive particles coated with a metal layer on polymer particles may be easily deformed by pressure, the conductive particles are suitable for electrically connecting the pads 1003 and the electrode pads 101.

The buffer material layer 1005 may also include a light-transparent matrix, but the inventive concepts are not limited thereto. For example, in some exemplary embodiments, the buffer material layer 1005 may reflect light or absorb light, and in this case, a matrix having light reflection properties or a matrix having light absorption properties may be used. Alternatively, a light absorbing material such as carbon black or a light scattering material such as silica may be contained in the matrix.

In an exemplary embodiment, the buffer material layer 1005 may have grooves 101g that are concavely formed in the region between the light emitting devices 100. Shapes of the grooves 101g may correspond to those of the electrode pads 101. In particular, the grooves 101g may be formed by the electrode pads 101. For example, when the light emitting device 100 has four electrode pads 101a, 101b, 101c, and 101d as shown in FIG. 4, at least four grooves 101g may be formed between two light emitting devices 100. However, the inventive concepts are not limited thereto, and in some exemplary embodiments, the buffer material layer 1005 may be removed in the region between the light emitting devices 100.

In an exemplary embodiment, the buffer material layer 1005 may be formed of, for example, an anisotropic conductive film (ACF). The conductive particles 1005a may be substantially uniformly distributed over substantially the entire region of the buffer material layer 1005. The conductive particles 1005b are disposed closer to one another and more densely disposed than the conductive particles 1005a.

According to an exemplary embodiment, the buffer material layer 1005 may be formed using an anisotropic conductive paste (ACP), and further, the buffer material layer 1005 may be formed using a self assembly anisotropic conductive paste (SAP) that includes solder particles. As such, the conductive particles 1005a may be aggregated between the pads 1003 and the electrode pads 101, and the conductive particles 1005a may scarcely remain or may not be retained in the region between the light emitting devices 100.

In another exemplary embodiment, the buffer material layer 1005 may be a non-conductive material layer that does not include conductive particles 1005a and 1005b, and the pads 1003 and electrode pads 101 may be bonded using In, Pb, AuSn, CuSn, or solder. For example, the buffer material layer 1005 may be formed of spin-on-glass (SOG) or BCB.

In some exemplary embodiments, a light blocking material layer may be disposed in the region between the light emitting devices 100. The light blocking material layer absorbs or reflects light, and thus, prevents light interference between light emitting devices 100, thereby improving a contrast ratio of a display. The light blocking material layer may cover the light emitting devices 100. The light blocking material layer will be described in detail later through a method of fabricating a display panel.

Figure 8:
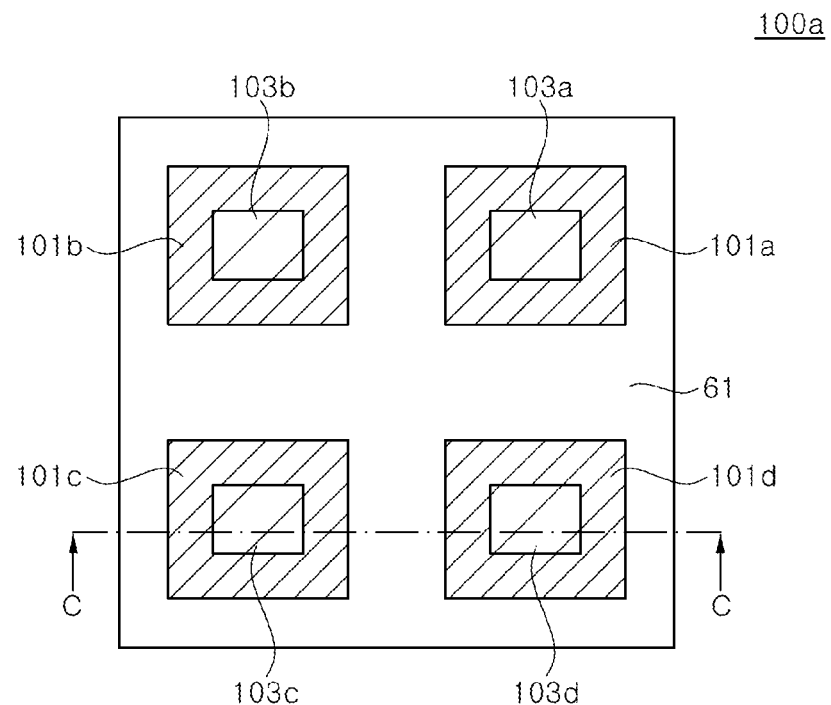
FIG. 8 is a schematic plan view illustrating a light emitting device according to another exemplary embodiment.
Figure 9:
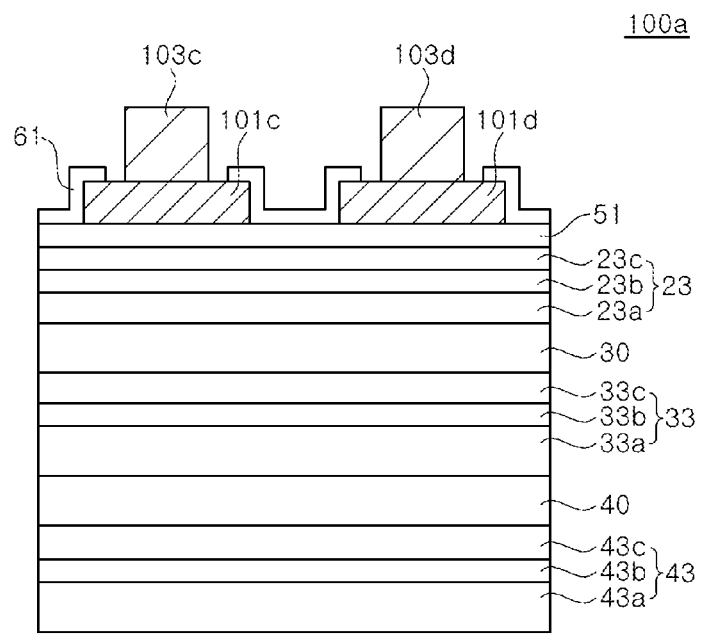
FIG. 9 is a schematic cross-sectional view taken along line C-C of FIG. 8.

FIG. 8 is a schematic cross-sectional view illustrating a light emitting device 100a according to another exemplary embodiment, and FIG. 9 is a schematic cross-sectional view taken along line C-C of FIG. 8.

Referring to FIGS. 8 and 9, the light emitting device 100a according to the illustrated exemplary embodiment includes bump pads 103a, 103b, 103c, and 103d that are provided on electrode pads 101a, 101b, 101c, and 101d, respectively. Furthermore, a second insulation layer 61 may cover the first insulation layer 51 and the electrode pads 101a, 101b, 101c, and 101d. The second insulation layer 61 may be formed of a silicon oxide film or a silicon nitride film.

The second insulation layer 61 may have openings exposing the electrode pads 101a, 101b, 101c, and 101d, and the bump pads 103a, 103b, 103c, and 103d may be disposed on the exposed electrode pads 101a, 101b, 101c, and 101d.

The bump pads 103a, 103b, 103c, and 103d may be disposed in the openings of the upper insulation layer 61, and upper surfaces of the bump pads 103a, 103b, 103c, and 103d may be substantially flat. The bump pads 103a, 103b, 103c, and 103d may be formed of Au/In, for example, in which Au may be formed to have a thickness of about 3 μm and In may be formed to have a thickness of about 1 The light emitting device 100a may be bonded to pads 1003 of a circuit board 1001 using In. In the illustrated exemplary embodiment, although the bump pads 103a, 103b, 103c, and 103d are described as being bonded using In, the inventive concepts are not limited thereto. For example, in some exemplary embodiments, the bump pads 103a, 103b, 103c, and 103d may be bonded using Pb or AuSn.

In the illustrated exemplary embodiment, the upper surfaces of the bump pads 103a, 103b, 103c, and 103d are described and illustrated as being flat, but the inventive concepts are not limited thereto. For example, in some exemplary embodiments, the upper surfaces of the bump pads 103a, 103b, 103c, and 103d may be irregular, and some of the bump pads may be disposed on the upper insulation layer 61.

Figure 10:
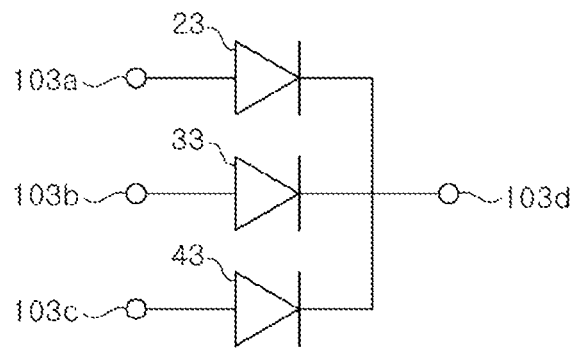
FIG. 10 is a schematic circuit diagram of a light emitting device according to another exemplary embodiment.

As shown in FIG. 10, the first LED stack 23 may be electrically connected to the bump pads 103a and 103d, the second LED stack 33 may be electrically connected to the bump pads 103b and 103d, and the third LED stack 43 may be electrically connected to the bump pads 103c and 103d. More particularly, cathodes of the first LED stack 23, the second LED stack 33, and the third LED stack 43 are commonly electrically connected to the bump pad 103d, and anodes thereof are electrically connected to the first, second, and third bump pads 103a, 103b, and 103c, respectively. Accordingly, the first, second, and third LED stacks 23, 33, and 43 may be driven independently.

Figure 11:
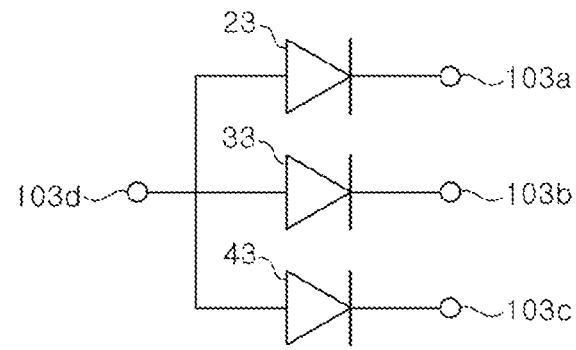
FIG. 11 is a schematic circuit diagram of a light emitting device according to another exemplary embodiment.

As shown in FIG. 11, according to another exemplary embodiment, anodes of the first LED stack 23, the second LED stack 33, and the third LED stack 43 may be commonly electrically connected to the bump pad 103d, and cathodes thereof may be electrically connected to the first, second, and third bump pads 103a, 103b, and 103c, respectively.

Hereinafter, a method of fabricating a display panel will be described, by which a structure of a display panel 1000 will be further described in more detail.

When a light emitting device 100a is transferred to a circuit board 1001, bump pads 103a, 103b, 103c, and 103d may be connected to pads 1003 of the circuit board 1001.

FIGS. 12A, 12B, 12C, 12D, and 12E are schematic cross-sectional views illustrating a method of fabricating the display panel according to an exemplary embodiment.

Figure 12A:
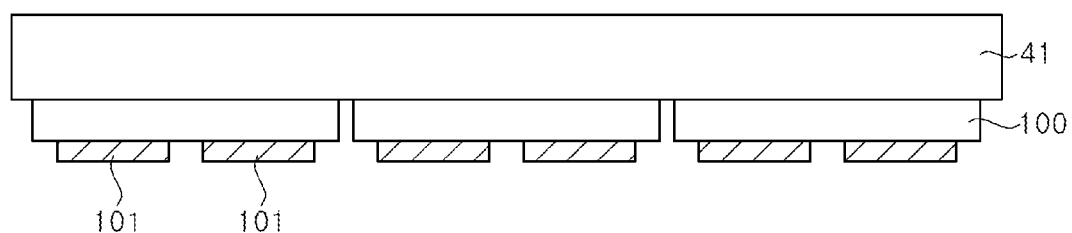
FIGS. 12A, 12B, 12C, 12D, and 12E are schematic cross-sectional views illustrating a method of fabricating a display panel according to an exemplary embodiment.

Referring to FIG. 12A, a plurality of light emitting devices 100 is formed on a substrate 41. The light emitting devices 100 include electrode pads 101. Since the light emitting device 100 is the same as that described above with reference to FIGS. 4 and 5, repeated descriptions thereof will be omitted to avoid redundancy.

The substrate 41 may be a growth substrate for growing semiconductor layers 43a, 43b, and 43c of a third LED stack 43. For example, the substrate 41 may be a gallium nitride substrate, a SiC substrate, a sapphire substrate, or a patterned sapphire substrate.

A second LED stack 33 may be bonded to the third LED stack 43 through the second bonding layer 40, and a first LED stack 23 may be bonded to the second LED stack 33 through the first bonding layer 30.

In an exemplary embodiment, after the first, second, and third LED stacks 23, 33, and 43 are bonded, a patterning process may be performed to separate a plurality of light emitting diode regions. Subsequently, a first insulation layer 51 and the electrode pads 101 may be formed. In addition, through holes may be formed in the first and second LED stacks 23 and 33 to electrically connect the electrode pads 101 and the first, second, and third LED stacks 23, 33 and 43, and a second conductivity type semiconductor layer 43c and an active layer 43b of the third LED stack 43 may be partially patterned. In addition, as described above, transparent electrodes may be formed on second conductivity type semiconductor layers 23c, 33c, and 43c of the first, second, and third LED stacks 23, 33, and 43.

Figure 12B:
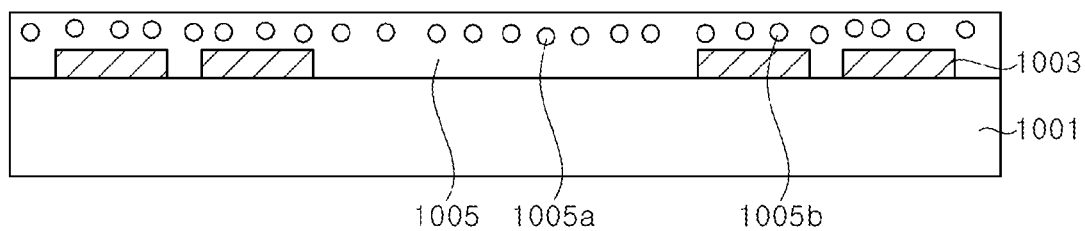

Referring to FIG. 12B, an anisotropic conductive film 1005 is attached to the circuit board 1001, on which pads 1003 are formed in each pixel region. The anisotropic conductive film 1005 includes conductive particles 1005a and 1005b. The anisotropic conductive film 1005 covers the pads 1003 of the circuit board 1001. The conductive particles 1005b in the anisotropic conductive film 1005 are located on the pads 1003.

As used herein, the conductive particles 1005a refer to the conductive particles disposed outside of an upper region of the pads 1003, and the conductive particles 1005b refer to the conductive particles disposed over the pads 1003. The conductive particles 1005a and 1005b have substantially the same structure and shape. A thickness of the anisotropic conductive film 1005 disposed over the pads 1003 is similar to or greater than that of the electrode pads 101.

Figure 12C:
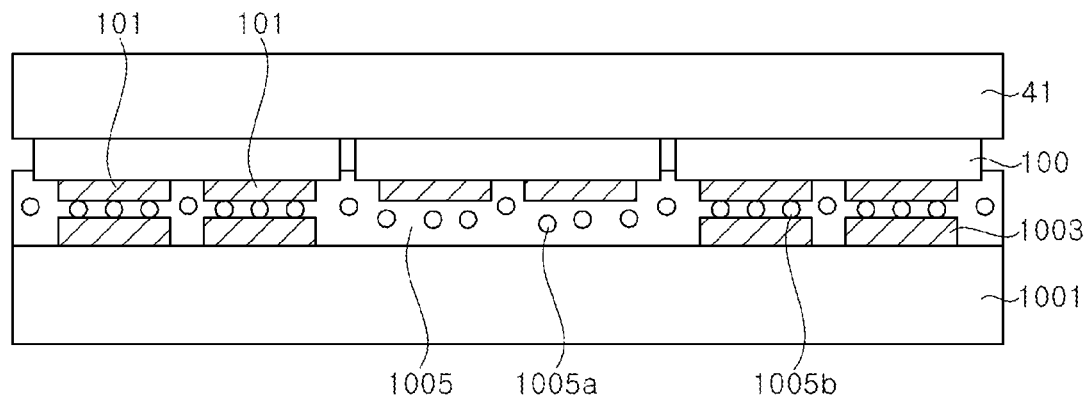

Referring to FIG. 12C, the light emitting devices 100 formed on the substrate 41 are bonded to the pads 1003 through the anisotropic conductive film 1005. In this case, the light emitting devices 100 on the substrate 41 may be more densely disposed than the light emitting devices 100 in the pixel regions. As such, as shown in the drawing, some of the light emitting devices 100 on the substrate 41 may be located between the pixel regions, and are not bonded to the pads 1003.

The pad 1003 and the electrode pad 101 are electrically connected by the conductive particles 1005b in the anisotropic conductive film 1005. The substrate 41 may be pressed toward the circuit board 1001, and thus, the conductive particles 1005b may be deformed by pressure. In addition, heat may be applied when the light emitting devices 100 are adhered to the anisotropic conductive film 1005. For example, a matrix of the anisotropic conductive film 1005 may be cured by heat.

A portion of the anisotropic conductive film 1005 may at least partially fill a gap between the light emitting devices 100. In this manner, the anisotropic conductive film 1005 may at least partially cover side surfaces of the light emitting devices 100.

After the light emitting devices 100 are attached to the anisotropic conductive film 1005, the light emitting devices 100 connected to the pads 1003 are irradiated with a laser through the substrate 41, and thus, the light emitting devices 100 are selectively separated from the substrate 41.

Figure 12D:
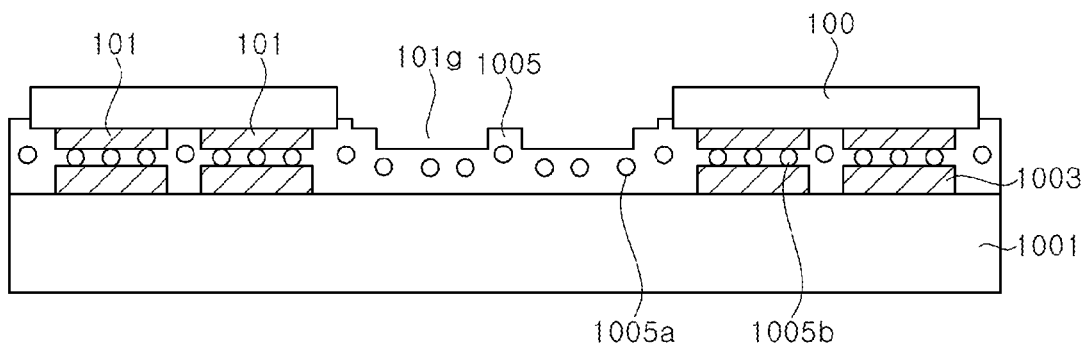

Referring to FIG. 12D, by separating the substrate 41 from the anisotropic conductive film 1005, the light emitting devices 100 connected to the pads 1003 are transferred onto the circuit board 1001, and the light emitting devices 100 that are not irradiated with a laser are separated from the anisotropic conductive film 1005. As such, the display panel 1000 in which the light emitting devices 100 are bonded to the pixel regions of the circuit board 1001 is fabricated.

As the light emitting devices 100 that are not irradiated with a laser are separated from the anisotropic conductive film 1005, grooves 101g may be formed by the electrode pads 101 on the surface of the anisotropic conductive film 1005.

Figure 12E:
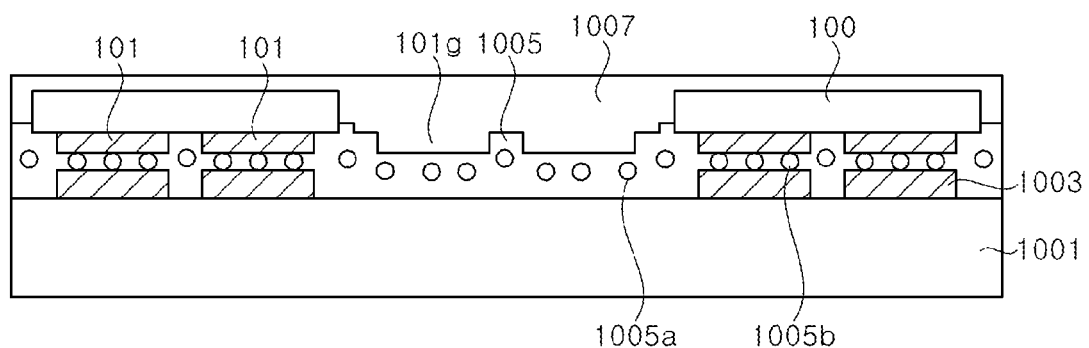

Referring to FIG. 12E, a light blocking material layer 1007 filling a region between the light emitting devices 100 may be further formed. The light blocking material layer 1007 may cover the side surfaces of the light emitting devices 100, and may further cover the upper surface of the light emitting devices 100. The light blocking material layer 1007 may cover the buffer material layer 1005 covering the circuit board 1001, and may fill the grooves 101g.

The light blocking material layer 1007 absorbs or reflects light emitted through the side surfaces of the light emitting devices 100 to prevent light interference between the light emitting devices 100. As such, the light blocking material layer 1007 may include, for example, a black molding agent, such as black epoxy or black silicone. In another exemplary embodiment, the light blocking material layer 1007 may include a light reflecting material, such as white epoxy or white silicone.

In the illustrated exemplary embodiment, although the light blocking material layer 1007 is illustrated as covering the upper surfaces of the light emitting devices 100, in some exemplary embodiments, the light blocking material layer 1007 may be formed to fill the region between the light emitting devices 100 while exposing the upper surfaces of the light emitting devices 100. In this case, an elevation of the light blocking material layer 1007 may be substantially the same as those of the upper surfaces of the light emitting devices 100.

According to the illustrated exemplary embodiment, by using the anisotropic conductive film 1005, an impact applied to the light emitting devices 100 while irradiating the light emitting devices 100 with a laser during a laser lift-off process may be mitigated by the anisotropic conductive film 1005. More particularly, the anisotropic conductive film 1005 may function as the buffer material layer to mitigate the impact applied to the light emitting devices 100, and thus, it is possible to prevent defects in the light emitting devices 100 during the transfer process.

In the illustrated exemplary embodiment, although the anisotropic conductive film 1005 is illustrated and described as being attached on the circuit board 1001, in some exemplary embodiments, the anisotropic conductive film 1005 may be attached on the substrate 41 to cover the light emitting devices 100.

In addition, in the illustrated exemplary embodiment, although the anisotropic conductive film 1005 is described as being attached to the circuit board 1001, in some exemplary embodiments, an anisotropic conductive paste may be additionally or alternatively used.

FIGS. 13A, 13B, 13C, 13D, and 13E are schematic cross-sectional views illustrating a method of fabricating a display panel according to another exemplary embodiment.

Figure 13A:
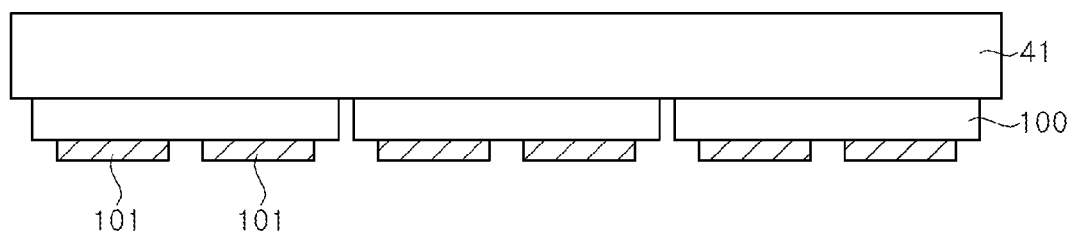
FIGS. 13A, 13B, 13C, 13D, and 13E are schematic cross-sectional views illustrating a method of fabricating a display panel according to another exemplary embodiment.

Referring to FIG. 13A, as described with reference to FIG. 12A, a plurality of light emitting devices 100 is formed on a substrate 41.

Figure 13B:
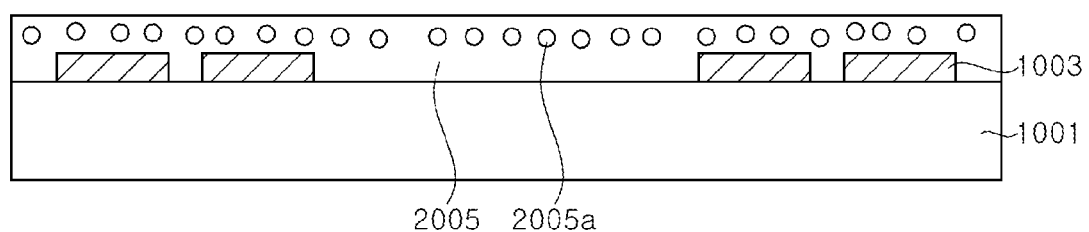

Referring to FIG. 13B, a self-assembled anisotropic conductive paste (SAP 2005) is formed on a circuit board 1001, on which pads 1003 are formed in each pixel area. The SAP 2005 has a structure in which conductive particles 2005a are dispersed in a resin, such as epoxy. The SAP 2005 may be formed on the circuit board 1001 using, for example, screen printing technology.

The conductive particles 2005a may be, for example, solder particles. The solder particles may include Sn, and may further include at least one element selected from Au, Ag, Bi, Cu, and In. A melting point of the solder particles may be lower than a curing temperature of the resin.

Figure 13C:
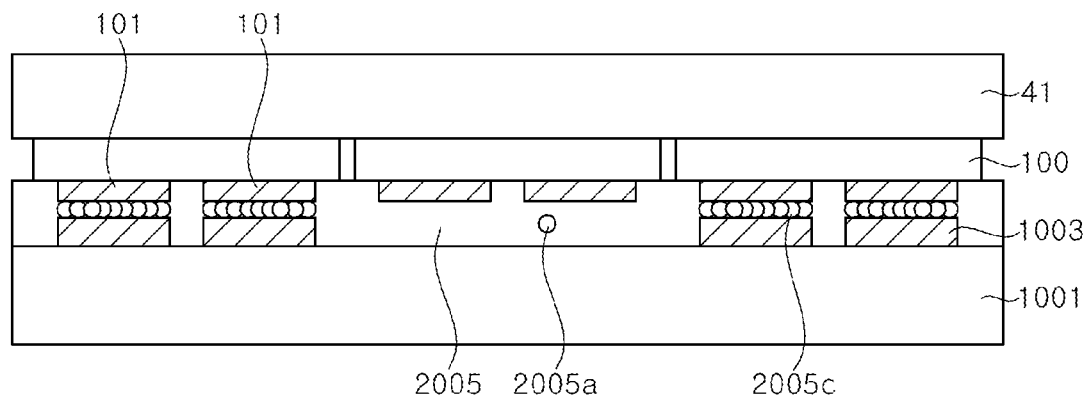

Referring to FIG. 13C, the substrate 41 on which the light emitting devices 100 are formed is placed on the SAP 2005. In this case, additional pressure may not need to be applied to the substrate 41. Then, heat is applied to the SAP 2005. Heat may be applied using an oven or hot plate, or heat may be applied locally using spot heating. As heat is applied to the SAP 2005, the conductive particles 2005a are agglomerated on the pads 1003 and electrode pads 101 to form an agglomerated conductive particle layer 2005c. A temperature at which the conductive particles 2005a aggregate may be lower than the curing temperature of the resin, and thus, the conductive particles may be aggregated before the resin is cured.

A portion of the SAP 2005 may at least partially fill a gap between the light emitting devices 100, and thus, may at least partially cover side surfaces of the light emitting devices 100.

The pads 1003 and the electrode pads 101 are electrically connected as the conductive particles 2005a are aggregated. Although some of the conductive particles 2005a may be remained in a region between the light emitting devices 100, as a large number of conductive particles 2005a aggregate on the pads 1003, a density thereof in the region between the light emitting devices 100 may be low.

Subsequently, the light emitting devices 100 are attached to the SAP 2005 by curing the resin. The conductive particle layer 2005c aggregated between the pads 1003 and the electrode pads 101 may maintain its shape of the particles, but as a temperature higher than the melting point of the conductive particles 2005a are applied during the curing process, the shape thereof may be changed as a single layer.

Figure 13D:
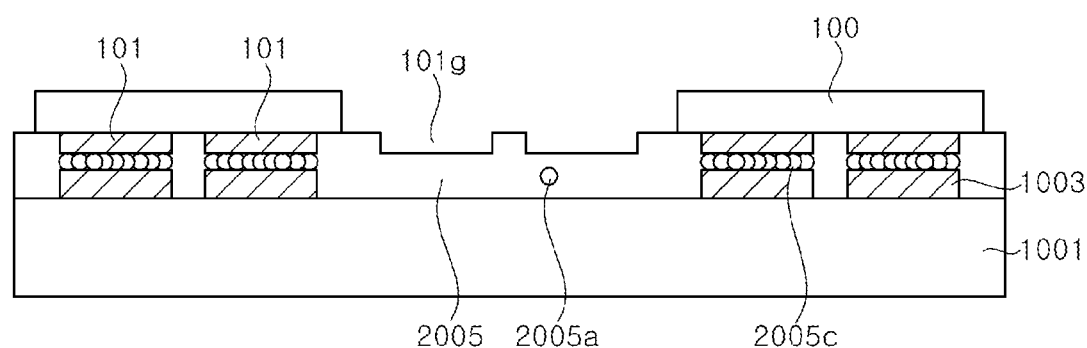

Referring to FIG. 13D, light emitting devices 100 are transferred onto the circuit board 1001 by separating the light emitting devices 100 connected to the pads 1003 from the substrate 41 by using a laser lift-off technique that selectively irradiates the light emitting devices 100 with a laser.

The light emitting devices 100 that are not connected to the pads 1003 are separated from the SAP 2005 together with the substrate 41. In this manner, grooves 101g may be formed on a surface of the SAP 2005.

In addition, referring to FIG. 13E, as described with reference to FIG. 12E, a light blocking material layer 1007 may fill the region between the light emitting devices 100. An elevation of an upper surface of the light blocking material layer 1007 may be substantially the same as those of the upper surfaces of the light emitting devices 100. In another exemplary embodiment, the light blocking material layer 1007 may cover the upper surfaces of the light emitting devices 100.

According to the illustrated exemplary embodiment, the pads 1003 and the electrode pads 101 may be stably and electrically connected by using the self-assembled anisotropic conductive paste 2005, thereby preventing occurrence of electrical short circuits. In addition, since an impact applied to the light emitting devices 100 may be alleviated using the SAP 2005, it is possible to prevent defects such as cracks in the light emitting devices 100 from the impact during the laser lift-off process, and thus, the light emitting devices 100 may be safely transferred onto the circuit board 1001 in a group.

FIGS. 14A, 14B, 14C, and 14D are schematic cross-sectional views illustrating a method of fabricating a display panel according to another exemplary embodiment.

Figure 14A:
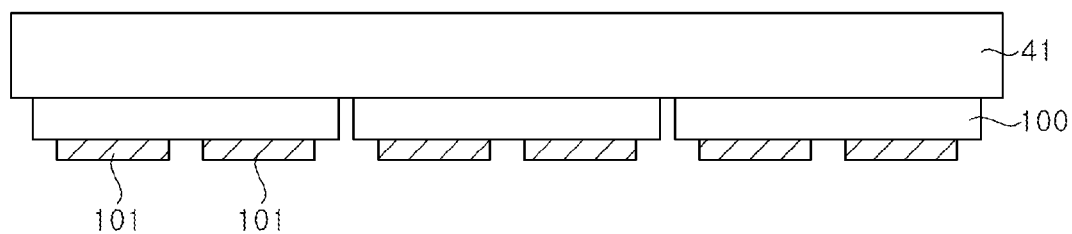
FIGS. 14A, 14B, 14C, and 14D are schematic cross-sectional views illustrating a method of fabricating a display panel according to another exemplary embodiment.

Referring to FIG. 14A, as described with reference to FIG. 12A, a plurality of light emitting devices 100 is formed on a substrate 41.

Figure 14B:
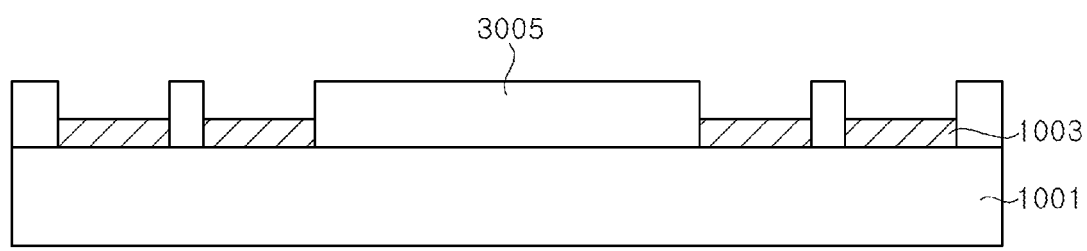

Referring to FIG. 14B, an insulation material layer 3005 is formed on a circuit board 1001 having pads 1003 thereon. The insulation material layer 3005 may include epoxy, polymer, spin-on-glass (SOG), BCB, or the like. The insulation material layer 3005 is formed to expose the pads 1003. For example, the insulation material layer 3005 may be patterned using photographic and etching techniques.

Figure 14C:
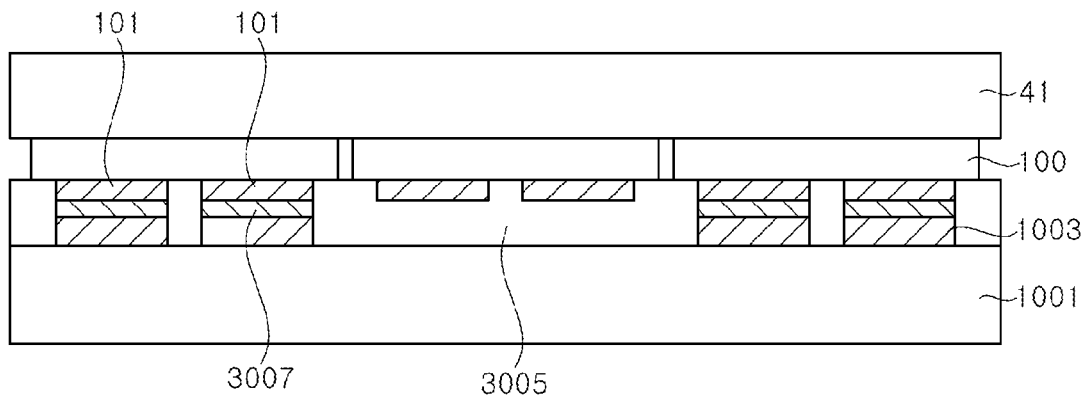

Referring to FIG. 14C, the substrate 41 on which the light emitting devices 100 are formed is disposed on the circuit board 1001. The pads 1003 and electrode pads 101 may be bonded to one another by a bonding layer 3007. The bonding layer 3007 may include, for example, AuIn, AuSn, CuSn, Au, Ni, or the like.

The bonding layer 3007 may be formed by forming a bonding material on the pads 1003 or on the electrode pads 101, and then bonding the pads 1003 and the electrode pads 101 to one another.

The insulation material layer 3005 may be cured after the pads 1003 and the electrode pads 101 are bonded. A portion of the insulation material layer 3005 may at least partially fill a gap between the light emitting devices 100.

Figure 14D:
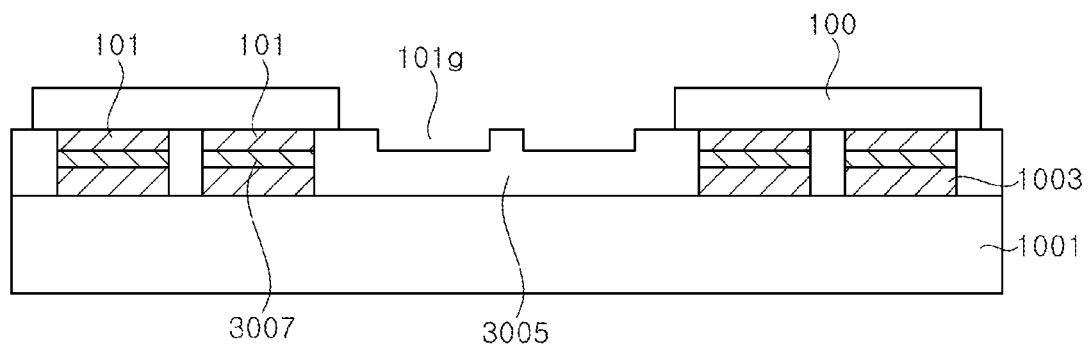

Referring to FIG. 14D, some of the light emitting devices 100 may be separated from the substrate 41 and transferred onto the circuit board 1001 using a selective laser lift-off technique.

Since some of the light emitting devices 100 are separated from the insulation material layer 3005, grooves 101g may be formed on a surface of the insulation material layer 3005.

Figure 13E:
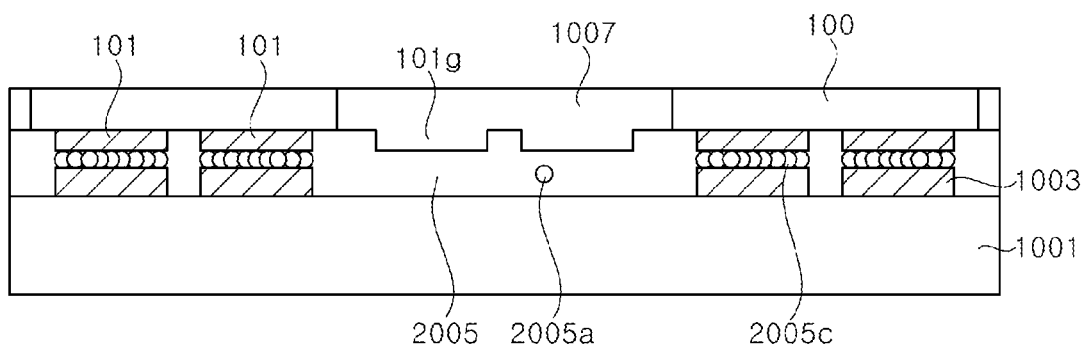

Then, a light blocking material layer 1007 may fill a region between the light emitting devices 100 as similarly shown in FIGS. 12E and 13E.

According to the illustrated exemplary embodiment, an impact applied to the light emitting devices 100 while irradiating the light emitting devices 100 with a laser may be alleviated by the insulation material layer 3005, and thus, defects in the light emitting devices 100 such as cracks may be prevented.

FIGS. 15A, 15B, 15C, and 15D are schematic cross-sectional views illustrating a method of fabricating a display panel according to another exemplary embodiment.

Figure 15A:
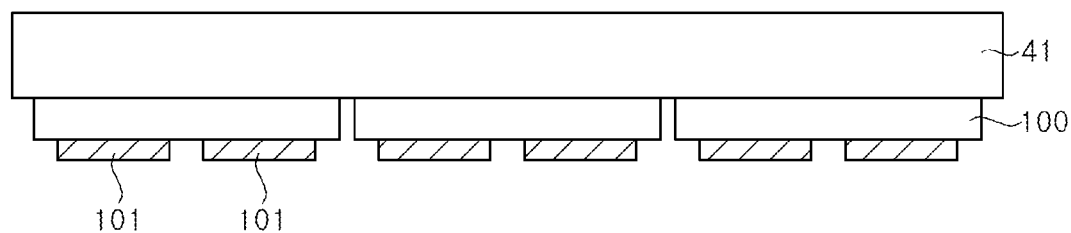
FIGS. 15A, 15B, 15C, and 15D are schematic cross-sectional views illustrating a method of fabricating a display panel according to another exemplary embodiment.

Referring to FIG. 15A and as described with reference to FIG. 12A, a plurality of light emitting devices 100 is formed on a substrate 41.

Figure 15B:
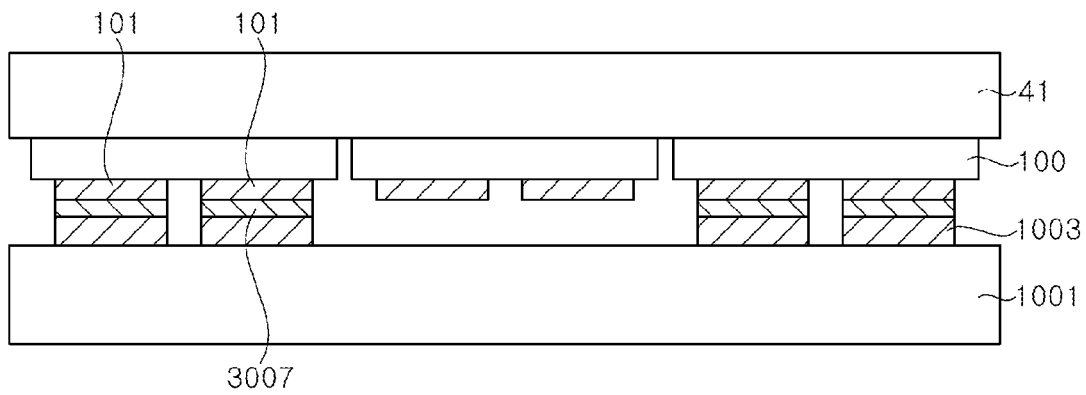
Figure 15C:
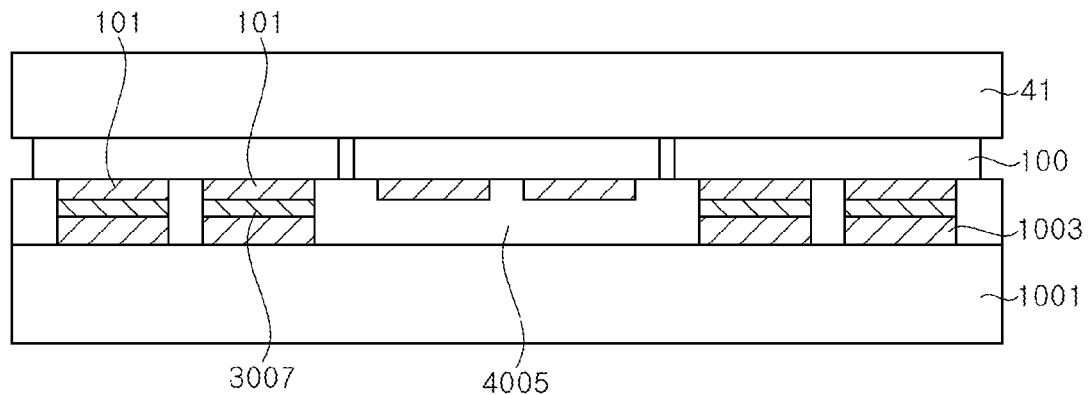

Referring to FIG. 15B, the substrate 41 on which light emitting devices 100 are formed is disposed on a circuit board 1001 on which pads 1003 are formed in pixel regions. Electrode pads 101 of the light emitting devices 100 may be bonded to pads 1003 by a bonding layer 3007. The bonding layer 3007 may include, for example, AuIn, AuSn, CuSn, Au, Ni, or the like. The bonding layer 3007 may be formed by forming a bonding material on the pads 1003 or on the electrode pads 101, and bonding the pads 1003 and the electrode pads 101 to each other.

Referring to 15C, a region between the substrate 41 and the circuit board 1001 is filled with an insulation material layer 4005. The insulation material layer 4005 may include epoxy, polymer, BCB, or the like. The insulation material layer 4005 may contact lower surfaces of the light emitting devices 100, and may cover side surfaces of the pads 1003 and electrode pads 101. Furthermore, a portion of the insulation material layer 4005 may at least partially fill a gap between the light emitting devices 100. Subsequently, the insulation material layer 4005 may be cured.

Figure 15D:
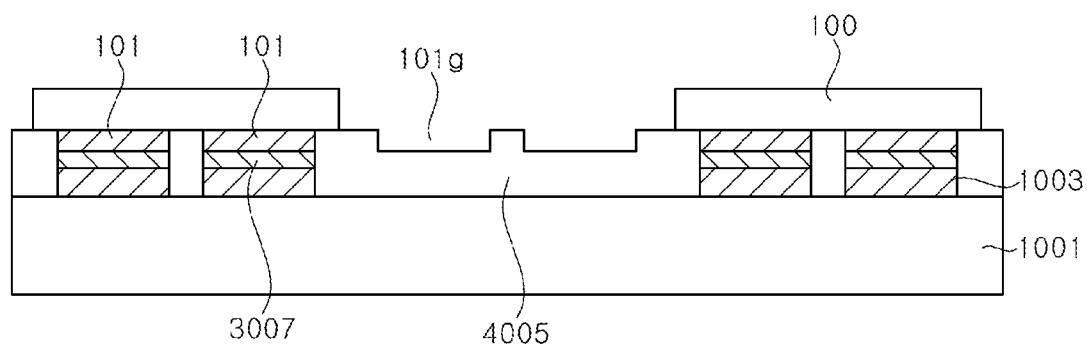

Referring to FIG. 15D, the light emitting devices 100 may be separated from the substrate 41 and transferred onto the circuit board 1001 by using a selective laser lift-off technique.

Since some of the light emitting devices 100 are separated from the insulation material layer 4005, grooves 101g may be formed on a surface of the insulation material layer 4005.

Then, a light blocking material layer 1007 may fill a region between the light emitting devices 100, as similarly shown in FIG. 12E or 13E.

According to the illustrated exemplary embodiment, an impact applied to the light emitting devices 100 while irradiating the light emitting devices 100 with a laser may be alleviated by the insulation material layer 4005, and thus, defects in the light emitting devices 100 such as cracks may be prevented.

FIGS. 16A, 16B, 16C, 16D, and 16E are schematic cross-sectional views illustrating a method of fabricating a display panel according to another exemplary embodiment.

Figure 16A:
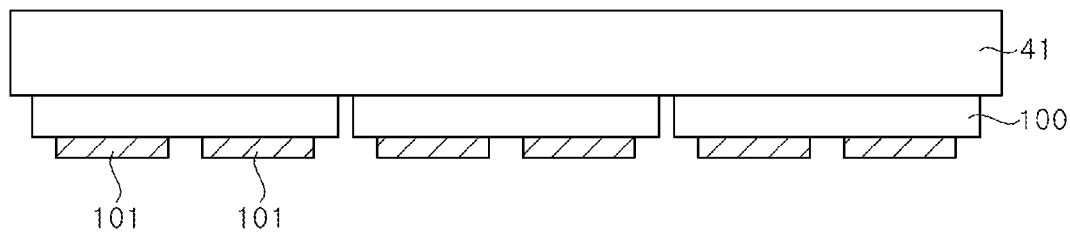
FIGS. 16A, 16B, 16C, 16D, and 16E are schematic cross-sectional views illustrating a method of fabricating a display panel according to another exemplary embodiment.

Referring to FIG. 16A, as described with reference to FIG. 12A, a plurality of light emitting devices 100 is formed on a substrate 41.

Figure 16B:
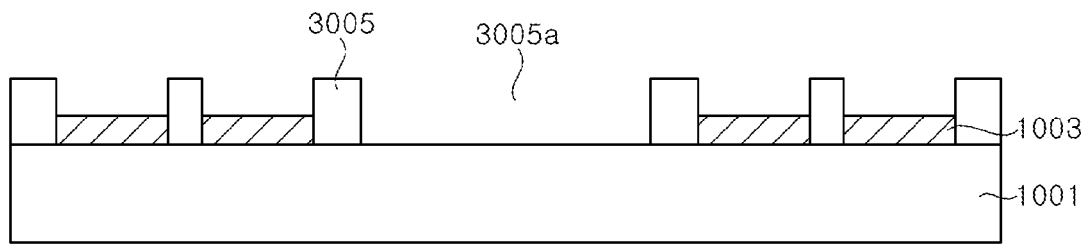

Referring to FIG. 16B, as described with reference to FIG. 14B, an insulation material layer 3005 is formed on a circuit board 1001 having pads 1003 thereon. The insulation material layer 3005 may include epoxy, polymer, spin-on-glass (SOG), BCB, or the like. However, the insulation material layer 3005 according to the illustrated exemplary embodiment may be formed to expose a portion of the circuit board 1001 as well as the pads 1003. In particular, the insulation material layer 3005 may be patterned so that the circuit board 1001 is exposed in a region between the pads 1003, and accordingly, opening 3005a may be formed. For example, the insulation material layer 3005 may be patterned using photographic and etching techniques.

Figure 16C:
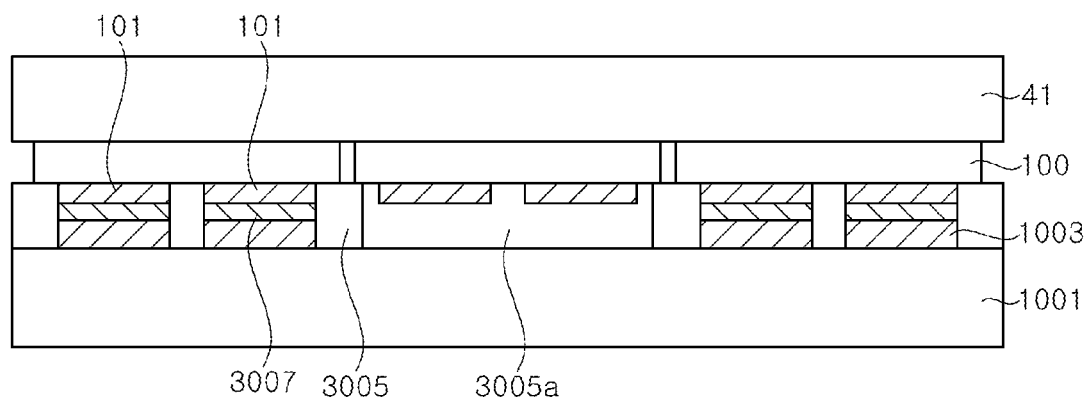

Referring to FIG. 16C, the substrate 41 on which the light emitting devices 100 are formed is disposed on the circuit board 1001. The pads 1003 and electrode pads 101 may be bonded to one another by a bonding layer 3007. The bonding layer 3007 may include, for example, AuIn, AuSn, CuSn, Au, Ni, or the like.

The bonding layer 3007 may be formed by forming a bonding material on the pads 1003 or on the electrode pads 101, and bonding the pads 1003 and the electrode pads 101 to each other.

The insulation material layer 3005 may be cured after the pads 1003 and the electrode pads 101 are bonded. A portion of the insulation material layer 3005 may at least partially cover side surfaces of the light emitting devices 100.

A light emitting device disposed between the light emitting devices 100 bonded to the circuit board 1001 is located in the opening 3005a of the insulation material layer 3005 on the circuit board 1001.

Figure 16D:
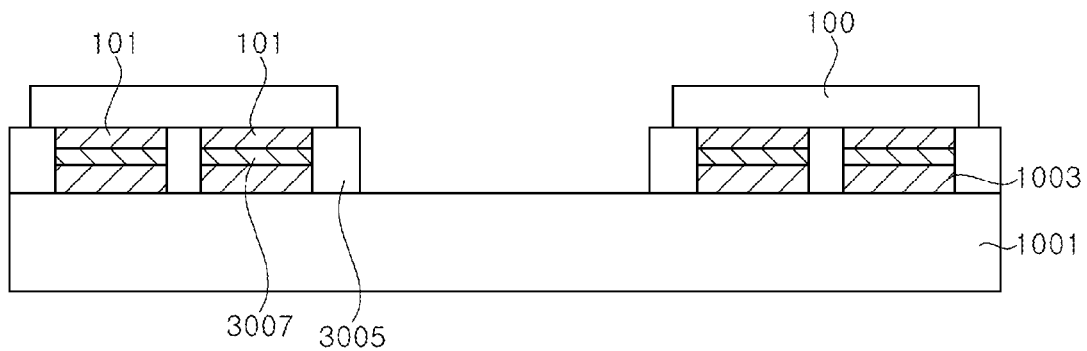

Referring to FIG. 16D, the light emitting devices 100 may be separated from the substrate 41 and transferred onto the circuit board 1001 by using a selective laser lift-off technique.

Some of the light emitting devices 100 are removed from the circuit board 1001 together with the substrate 41. In this case, since the light emitting devices 100 that are removed together with the substrate 41 are disposed over the opening 3005a of the insulation material layer 3005, grooves 101g described above may not be formed on the insulation material layer 3005.

Figure 16E:
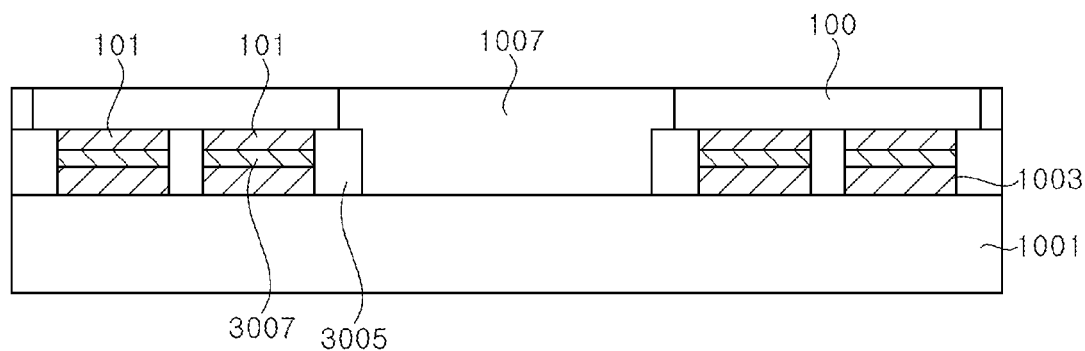

Referring to FIG. 16E, as described with reference to FIG. 12E or 13E, a light blocking material layer 1007 may fill a region between the light emitting devices 100. The light blocking material layer 1007 may cover a portion of an upper surface of the insulation material layer 3005. In addition, as described above, the light blocking material layer 1007 may cover upper surfaces of the light emitting devices 100.

According to the illustrated exemplary embodiment, an impact applied to the light emitting devices 100 while irradiating the light emitting devices 100 with a laser may be alleviated by the insulation material layer 3005, and thus, defects in the light emitting devices 100 such as cracks may be prevented.

FIGS. 17A, 17B, 17C, 17D, and 73E are schematic cross-sectional views illustrating a method of fabricating a display panel according to another exemplary embodiment.

Referring to FIGS. 17A, 17B, 17C, 17D, and 17E, the method of fabricating a display panel according to the illustrated exemplary embodiment is substantially similar to that described with reference to FIGS. 12A, 12B, 12C, 12D, and 12E, however, an anisotropic conductive film 1005 or an anisotropic conductive paste is patterned before bonding the light emitting devices 100. Hereinafter, the steps of the manufacturing method different from those already above will be mainly described to avoid redundancy.

Figure 17A:
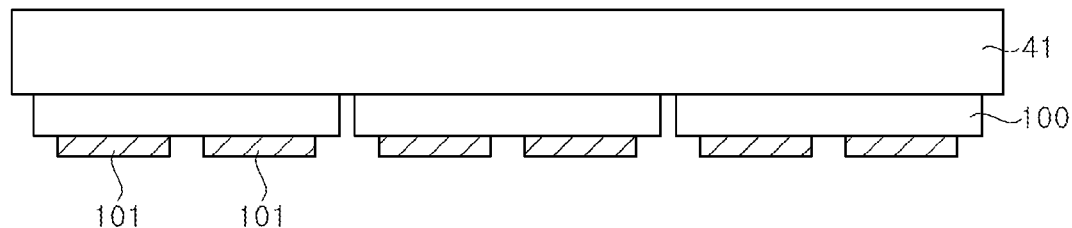
FIGS. 17A, 17B, 17C, 17D, and 17E are schematic cross-sectional views illustrating a method of fabricating a display panel according to another exemplary embodiment.
Figure 17B:
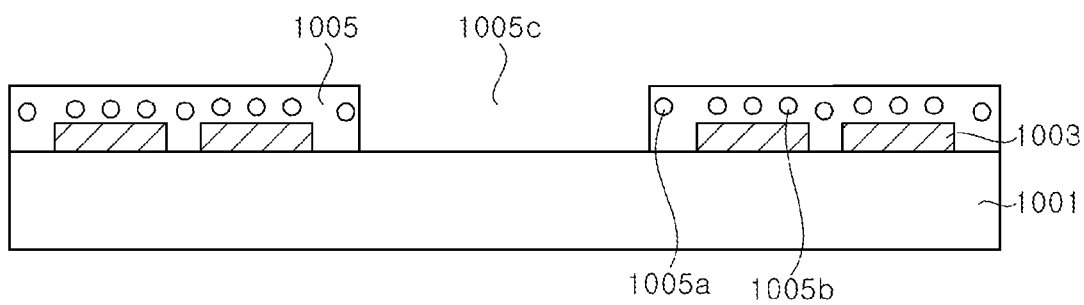

As shown in FIG. 17B, the anisotropic conductive film 1005 or an anisotropic conductive paste may be patterned to have an opening 1005c exposing a surface of a circuit board 1001 between pads 1003. In particular, when the anisotropic conductive paste is used, it may be patterned using a screen printing technique or the like. In another exemplary embodiment, the anisotropic conductive film 1005 or the anisotropic conductive paste may be formed of a photosensitive polymer or the like and patterned using photo and etching techniques.

Figure 17C:
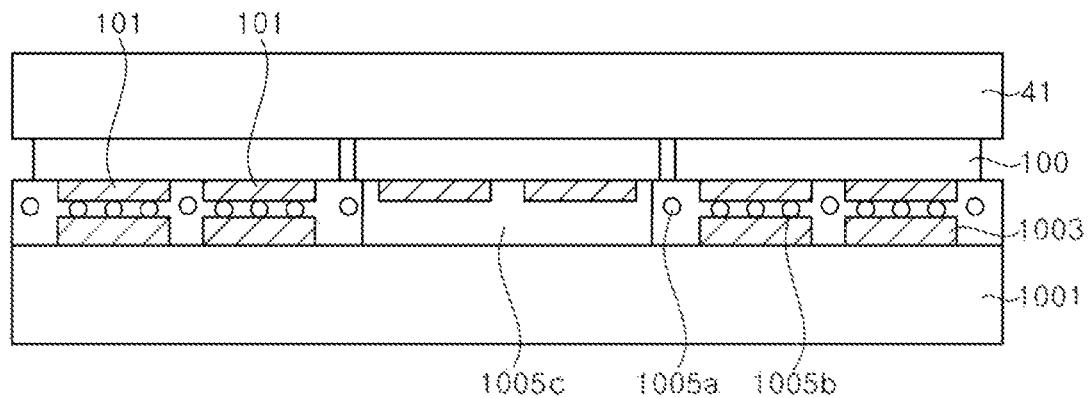

As shown in FIG. 17C, the anisotropic conductive film 1005 or the anisotropic conductive paste may be patterned to have a wider width than that of the light emitting device 100, and thus, an entire lower surface of the light emitting device 100 may be attached to the conductive film 1005 or the anisotropic conductive paste. Furthermore, a side surface of the light emitting device 100 may be partially covered with the anisotropic conductive film 1005 or the anisotropic conductive paste.

Since the entire lower surface of the light emitting device 100 is in contact with the anisotropic conductive film 1005 or the anisotropic conductive paste, when irradiating the light emitting devices 100 with a laser, it is possible to mitigate an impact applied to the light emitting devices 100 by the anisotropic conductive film 1005 or the anisotropic conductive paste.

Figure 17D:
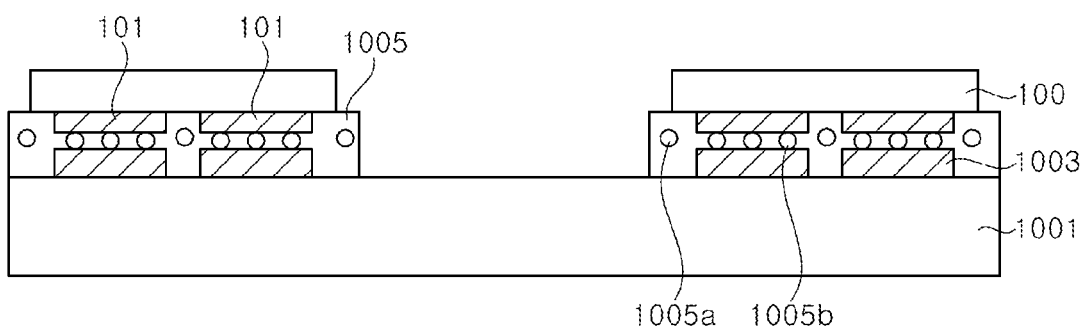

Referring to FIG. 17D, the light emitting devices 100 are transferred onto the circuit board 1001, and the circuit board 1001 may be exposed in a region between the light emitting devices 100. As such, grooves 101g that may be formed during the manufacturing steps described above may not be formed.

Figure 17E:
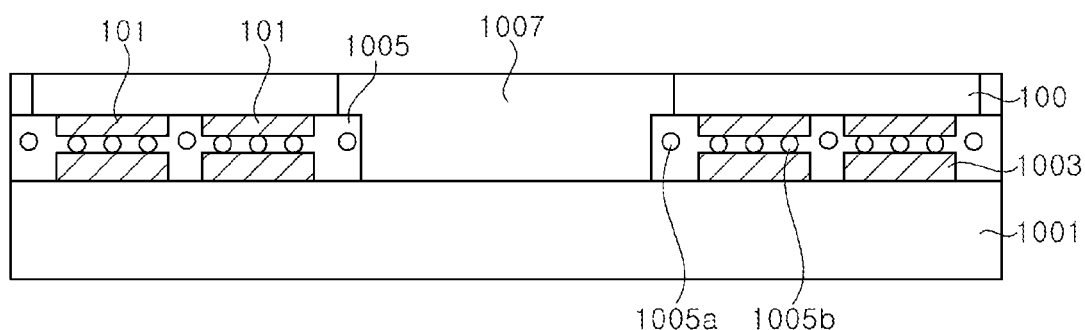

Referring to FIG. 17E, the region between the light emitting devices 100 may be filled with a light blocking material layer 1007. In the illustrated exemplary embodiment, the light blocking material layer 1007 may contact the surface of the circuit board 1001. Furthermore, the light blocking material layer 1007 may partially cover an upper surface of the anisotropic conductive film 1005 or the anisotropic conductive paste. In some exemplary embodiments, the light blocking material layer 1007 may cover upper surfaces of the light emitting devices 10 as that described with reference to FIG. 12E.

FIGS. 18A, 18B, 18C, and 18D are schematic cross-sectional views illustrating a method of fabricating a display panel according to another exemplary embodiment.

The methods of fabricating a display panel according to exemplary embodiments described above employs selectively transferring the light emitting devices 100 disposed on the substrate 41 onto the circuit board 1001 using a laser lift-off technique. As described above, the substrate 41 may be a growth substrate that is used to grow the first LED stack 43, for example, a sapphire substrate.

However, the inventive concepts are not limited to transferring the light emitting devices 100 using the laser lift-off technique. More particularly, according to the illustrated exemplary embodiment, after individual light emitting diode chips are rearranged in advance according to an interval between pads 1003, the light emitting devices may be transferred to a circuit board 1001 using a temporary tape. FIGS. 18A, 18B, 18C, and 18D show a method of transferring light emitting diode chips that are rearranged in advance to the circuit board 1001 using the tape.

Figure 18A:
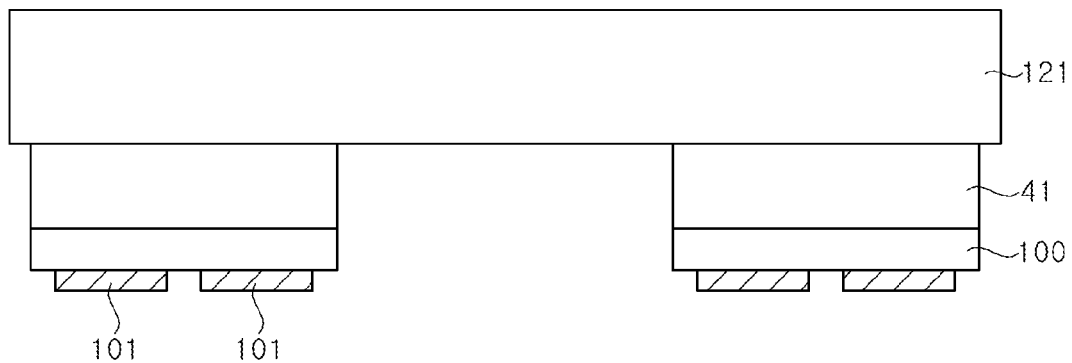
FIGS. 18A, 18B, 18C, and 18D are schematic cross-sectional views illustrating a method of fabricating a display panel according to another exemplary embodiment.

Referring to FIG. 18A, the light emitting diode chips on which the light emitting device 100 is formed on a substrate 41 are arranged and prepared on a tape 121. The light emitting diode chips may be arranged to correspond to an interval between the pads 1003 of the circuit board 1001. The tape 121 may be provided on a temporary substrate. The light emitting diode chips may be provided by dividing the substrate 41 into individual chip units after forming the light emitting devices 100 on the substrate 41.

Figure 18B:
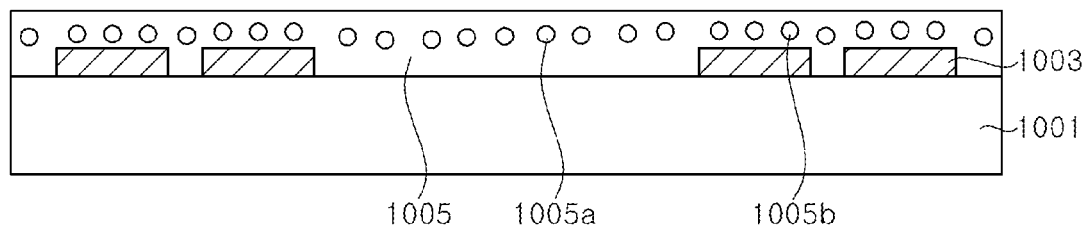

Referring to FIG. 18B, as described with reference to FIG. 12B, an anisotropic conductive film 1005 is formed on the circuit board 1001. In some exemplary embodiments, an anisotropic conductive paste may be used instead of the anisotropic conductive film 1005.

Figure 18C:
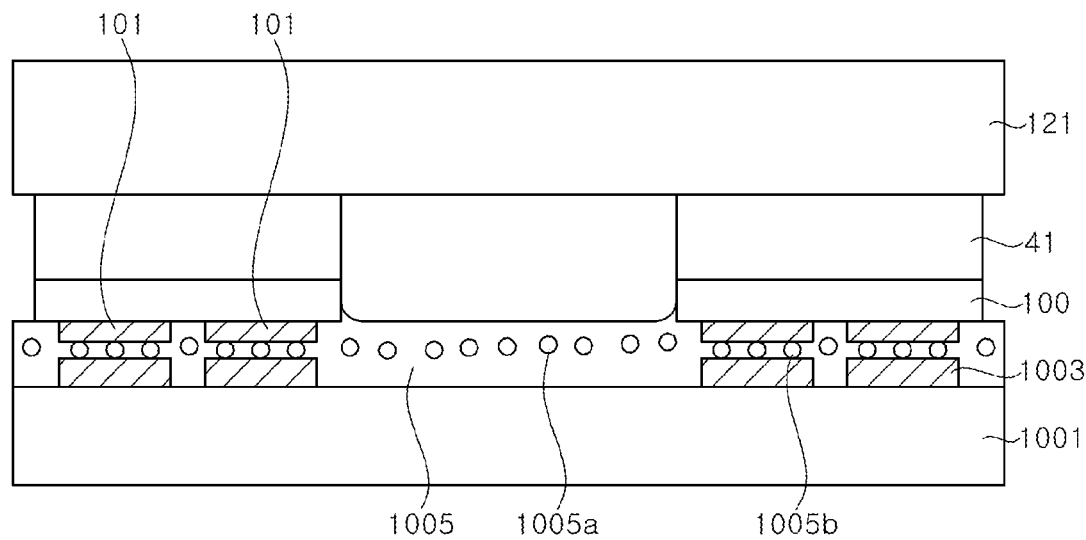

Referring to FIG. 18C, the light emitting diode chips attached to the tape 121 are bonded to the pads 1003 through the anisotropic conductive film 1005. In the illustrated exemplary embodiment, since the light emitting diode chips are rearranged in advance to correspond to the pixel regions, the light emitting diode chips are bonded to the pads 1003 corresponding to the pixel regions as shown in the drawing.

The pad 1003 and the electrode pad 101 are electrically connected by conductive particles 1005b in the anisotropic conductive film 1005. The substrate 41 may be pressed toward the circuit board 1001, and thus, the conductive particles 1005b may be deformed by pressure. In addition, heat may be applied when the light emitting devices 100 are adhered to the anisotropic conductive film 1005. For example, a matrix of the anisotropic conductive film 1005 may be cured by heat. In this case, a portion of the anisotropic conductive film 1005 may at least partially cover side surfaces of the light emitting devices 100 as shown in the drawing.

Figure 18D:
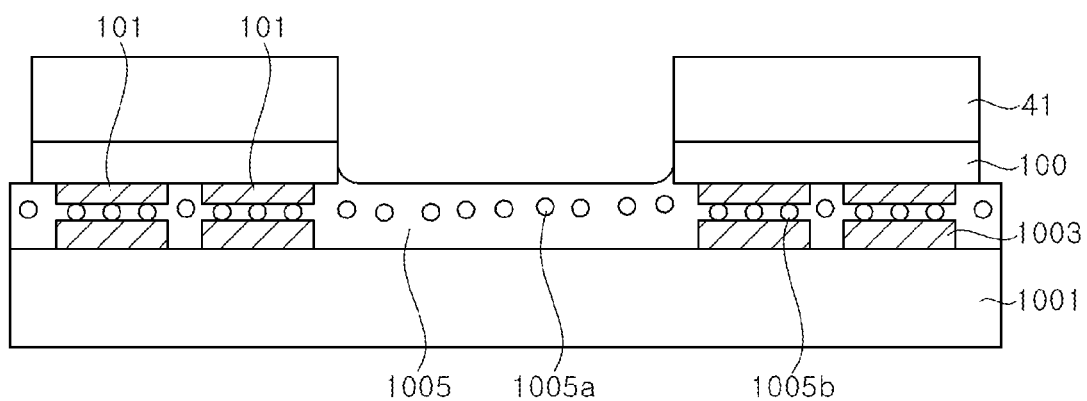

Referring to FIG. 18D, the light emitting diode chips are transferred onto the circuit board 1001 by separating the tape 121 from the light emitting diode chips, and thus, a display panel 1000 in which light emitting diode chips are bonded to pixel regions of the circuit board 1001 is fabricated. In this case, the light emitting diode chips may include the light emitting device 100 and the substrate 41, respectively.

In addition, a light blocking material layer may be disposed in a region between the light emitting diode chips. The light blocking material layer may cover the side surfaces of the light emitting devices 100 and the side surfaces of the substrate 41. In addition, the light blocking material layer may cover a surface of the substrate 41.

In the illustrated exemplary embodiment, although the light emitting diode chips arranged on the tape 121 are described as being transferred onto the circuit board 1001 using the anisotropic conductive film 1005 or the anisotropic conductive paste, the inventive concepts are not limited thereto. For example, the light emitting diode chips may be transferred onto the circuit board 1001 using any one of the transferring methods described with reference to FIGS. 13A through 13E, FIGS. 14A through 14D, FIGS. 15A through 15D, FIGS. 16A through 16E, and FIGS. 17A through 17E may also be applied.

Further, in the above-described exemplary embodiments, although the electrode pads 101 are illustrated and described as being connected to the pads 1003, the inventive concepts are not limited thereto. For example, the light emitting devices 100a may be transferred to the circuit board 1001 as similarly described with reference to FIGS. 8 and 9, and thus, the bump pads 103a, 103b, 103c, and 103d of the light emitting device 100a may be connected to the pads 1003. In this case, the grooves 101g formed in the buffer material layers 1005, 2005, 3005, and 4005 between the light emitting devices 100 may be formed by the bump pads 103a, 103b, 103c, and 103d.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display panel, comprising:
   a circuit board having pads;
   light emitting devices electrically connected to the pads and arranged on the circuit board, each light emitting device having a first surface facing the circuit board and a second surface opposite to the first surface;
   a buffer material layer disposed between the circuit board and the light emitting devices to fill a space between the circuit board and the light emitting devices; and
   a cover layer covering the second surface of the light emitting devices,
   wherein:
   the buffer material layer is disposed under the first surfaces of the light emitting devices and has grooves in a region between adjacent light emitting devices;
   a portion of a top surface of the buffer material layer is disposed between adjacent light emitting devices;
   the cover layer fills the grooves of the buffer material layer; and
   a width of at least one of the grooves that is covered by the cover layer corresponds to a distance between the adjacent light emitting devices.

2. The display panel of claim 1, wherein at least a portion of the cover layer has a greater thickness than that of the buffer material layer.

3. The display panel of claim 1, wherein the second surface of the light emitting device is exposed from the buffer material layer.

4. The display panel of claim 1, wherein at least a portion of the buffer material layer is disposed at an elevation between the first and second surfaces of the light emitting device.

5. The display panel of claim 4, wherein at least a portion of the cover layer is disposed at an elevation between the first and second surfaces of the light emitting device.

6. The display panel of claim 1, wherein the light emitting devices includes a first LED stack, a second LED stack, and a third LED stack configured to emit light having different wavelengths.

7. The display panel of claim 1, wherein at least some of the light emitting devices adjacent to each other are spaced apart by a distance greater than a width of the light emitting device.

8. The display panel of claim 1, wherein each of the light emitting devices includes electrode pads electrically connected to the pads.

9. The display panel of claim 8, wherein the buffer material layer is disposed between the electrode pads.

10. The display panel of claim 1, wherein the buffer material layer includes cured resin, polymer, BCB, or SOG.

11. A display panel, comprising:
a circuit board having pads;
light emitting devices electrically connected to the pads and arranged on the circuit board, each light emitting device having a first surface facing the circuit board and a second surface opposite to the first surface;
a buffer material layer disposed between the circuit board and the light emitting devices to fill a space between the circuit board and the light emitting devices; and
a cover layer covering the second surface of the light emitting devices,
wherein:
the buffer material layer is disposed under the first surfaces of the light emitting devices and has grooves in a region between adjacent light emitting devices;
the buffer material layer covers a side surface of the pads;
the cover layer fills the grooves of the buffer material layer; and
a width of at least one of the grooves that is covered by the cover layer corresponds to a distance between the adjacent light emitting devices.

12. The display panel of claim 11, wherein at least a portion of the cover layer has a greater thickness than that of the buffer material layer.

13. The display panel of claim 11, wherein the second surface of the light emitting device is exposed from the buffer material layer.

14. The display panel of claim 11, wherein at least a portion of the buffer material layer is disposed at an elevation between the first and second surfaces of the light emitting device.

15. The display panel of claim 11, wherein at least some of the light emitting devices adjacent to each other are spaced apart by a distance greater than a width of the light emitting device.

16. A display panel, comprising:
a circuit board having pads;
light emitting devices electrically connected to the pads and arranged on the circuit board, each light emitting device having a first surface facing the circuit board and a second surface opposite to the first surface;
a buffer material layer disposed between the circuit board and the light emitting devices; and
a cover layer covering the second surface of the light emitting devices,
wherein:
the buffer material layer covers a side surface of the pads;
the buffer material layer has a groove and fills a space between the circuit board and the light emitting devices; and
a width of at least one of the grooves that is covered by the cover layer corresponds to a distance between the adjacent light emitting devices.

17. The display panel of claim 16, wherein at least a portion of the cover layer has a greater thickness than that of the buffer material layer.

18. The display panel of claim 16, wherein the second surface of the light emitting device is exposed from the buffer material layer.

19. The display panel of claim 16, wherein at least a portion of the cover layer is disposed at an elevation between the first and second surfaces of the light emitting device.

20. The display panel of claim 16, wherein the groove is disposed between adjacent pads.

* * * * *